United States Patent
Kawano et al.

(10) Patent No.: US 9,784,481 B2
(45) Date of Patent: Oct. 10, 2017

(54) HEAT-RECOVERY-TYPE REFRIGERATING APPARATUS

(71) Applicant: DAIKIN INDUSTRIES, LTD., Osaka-shi, Osaka (JP)

(72) Inventors: Satoshi Kawano, Sakai (JP); Tomohisa Takeuchi, Sakai (JP); Sayako Kimura, Sakai (JP); Shinya Matsuoka, Sakai (JP)

(73) Assignee: Daikin Industries, Ltd., Osaka (JP)

( * ) Notice: Subject to any disclaimer, the term of this patent is extended or adjusted under 35 U.S.C. 154(b) by 0 days.

(21) Appl. No.: 15/025,234

(22) PCT Filed: Sep. 4, 2014

(86) PCT No.: PCT/JP2014/073319
§ 371 (c)(1),
(2) Date: Mar. 25, 2016

(87) PCT Pub. No.: WO2015/053016
PCT Pub. Date: Apr. 16, 2015

(65) Prior Publication Data
US 2016/0238285 A1 Aug. 18, 2016

(30) Foreign Application Priority Data

Oct. 7, 2013 (JP) ................................. 2013-210146

(51) Int. Cl.
*F25B 27/00* (2006.01)
*F25B 13/00* (2006.01)
(Continued)

(52) U.S. Cl.
CPC ............ *F25B 13/00* (2013.01); *F25B 31/006* (2013.01); *F25B 39/028* (2013.01); *F25B 49/02* (2013.01);
(Continued)

(58) Field of Classification Search
CPC .. F25B 6/02; F25B 13/00; F25B 40/02; F25B 5/02; F25B 2313/02323
See application file for complete search history.

(56) References Cited

U.S. PATENT DOCUMENTS 4,720,981 A 1/1988 Helt et al.
5,009,078 A * 4/1991 Ohkoshi ................. F24F 3/065
62/160

(Continued)

FOREIGN PATENT DOCUMENTS

EP 1 037 001 A1 2/2000
EP 1 793 179 A1 6/2007
(Continued)

OTHER PUBLICATIONS

International Search Report of corresponding PCT Application No. PCT/JP2014/073319 dated Dec. 2, 2014.
(Continued)

*Primary Examiner* — David Teitelbaum
(74) *Attorney, Agent, or Firm* — Global IP Counselors, LLP

(57) ABSTRACT

A heat-recovery-type refrigerating apparatus includes a compressor, a heat-source-side heat exchanger, and a plurality of usage-side heat exchangers, and refrigerant is sent from the usage-side heat exchanger functioning as a refrigerant radiator to the usage-side heat exchanger functioning as a refrigerant evaporator, whereby heat can be recovered between the usage-side heat exchangers. Here, a portion of the heat-source-side heat exchanger is configured as a precooling heat exchanger for always circulating high-pressure vapor refrigerant discharged from the compressor, and a refrigerant cooler for cooling an electrical equipment item is connected to a downstream side of the precooling heat exchanger.

8 Claims, 11 Drawing Sheets

(51) Int. Cl.
*H05K 7/20* (2006.01)
*F25B 39/02* (2006.01)
*F25B 31/00* (2006.01)
*F25B 49/02* (2006.01)
*F25B 6/02* (2006.01)
*F25B 40/02* (2006.01)
*F25B 5/02* (2006.01)
*F25B 41/00* (2006.01)
*F25B 41/04* (2006.01)

(52) U.S. Cl.
CPC ............ *H05K 7/20354* (2013.01); *F25B 5/02* (2013.01); *F25B 6/02* (2013.01); *F25B 40/02* (2013.01); *F25B 41/003* (2013.01); *F25B 41/04* (2013.01); *F25B 2313/007* (2013.01); *F25B 2313/021* (2013.01); *F25B 2313/0231* (2013.01); *F25B 2313/0253* (2013.01); *F25B 2313/02323* (2013.01); *F25B 2600/2515* (2013.01)

(56) References Cited

U.S. PATENT DOCUMENTS

| | | | | |
|---|---|---|---|---|
| 5,220,809 A * | 6/1993 | Voss | ...................... | B60H 1/323 165/80.4 |
| 5,388,419 A | 2/1995 | Kaye | | |
| 6,334,323 B1 | 1/2002 | Kidwell | | |
| 6,658,867 B1 * | 12/2003 | Taras | ....................... | F25B 5/04 62/117 |
| 2012/0043390 A1 * | 2/2012 | Noh | ........................ | F24D 3/08 237/2 A |
| 2012/0266618 A1 * | 10/2012 | Levy | .................... | F24F 3/1417 62/101 |
| 2015/0040597 A1 | 2/2015 | Ariyama et al. | | |

FOREIGN PATENT DOCUMENTS

| | | |
|---|---|---|
| EP | 2 182 306 A1 | 8/2007 |
| JP | 2001-99512 A | 4/2001 |
| JP | 2010-25374 A | 2/2010 |
| WO | 2006/003860 A1 | 1/2006 |
| WO | 2011/067905 A1 | 6/2011 |
| WO | 2013145006 A1 | 10/2013 |

OTHER PUBLICATIONS

International Preliminary Report of corresponding PCT Application No. PCT/JP2014/073319 dated Apr. 21, 2016.

Supplementary European Search Report of corresponding Ep Application No. 14 85 2612.2 dated Oct. 4, 2016.

* cited by examiner

HEAT-RECOVERY-TYPE REFRIGERATING APPARATUS

CROSS-REFERENCE TO RELATED APPLICATIONS

This U.S. National stage application claims priority under 35 U.S.C. §119(a) to Japanese Patent Application No, 2013-210146, filed in Japan on Oct. 7, 2013, the entire contents of which are hereby incorporated herein by reference.

TECHNICAL FIELD

The present invention relates to a heat-recovery-type refrigerating apparatus, and relates particularly to a heat-recovery-type refrigerating apparatus which includes a compressor, a heat-source-side heat exchanger, and a plurality of usage-side heat exchangers, in which refrigerant is sent from the usage-side heat exchanger functioning as a refrigerant radiator to the usage-side heat exchanger functioning as a refrigerant evaporator, whereby heat can be recovered between the usage-side heat exchangers.

BACKGROUND ART

As disclosed in Japanese Laid-open Patent Application No. 2010-25374, a refrigerating apparatus is conventionally known in which a refrigerant cooler is provided for cooling a power element or other electrical equipment item for controlling a compressor or other constituent device through use of refrigerant flowing between a heat-source-side heat exchanger and a usage-side heat exchanger. In this refrigerating apparatus, the degree of cooling of the electrical equipment item is determined according to the flow rate of the refrigerant flowing through the refrigerant cooler, i.e., the flow rate of the refrigerant flowing between the heat-source-side heat exchanger and the usage-side heat exchanger.

SUMMARY

A heat-recovery-type refrigerating apparatus is also conventionally known as a refrigerating apparatus configured so as to include a compressor, a heat-source-side heat exchanger, and a plurality of usage-side heat exchangers. In this heat-recovery-type refrigerating apparatus, the usage-side heat exchangers can each individually be switched between functioning as refrigerant evaporators or refrigerant radiators, and refrigerant is sent from a usage-side heat exchanger functioning as a refrigerant radiator to a usage-side heat exchanger functioning as a refrigerant evaporator, whereby heat is recovered between the usage-side heat exchangers (e.g., simultaneous cooling/heating operation is performed in which air-cooling operation and air-heating operation are performed simultaneously). The heat-recovery-type refrigerating apparatus is configured so that the heat-source-side heat exchanger is caused to function as a refrigerant evaporator or a refrigerant radiator in accordance with the overall heat load (evaporation load and/or radiation load) of the plurality of usage-side heat exchangers, taking into account the heat recovery described above.

The conventional refrigerant cooler described above may conceivably be applied to such a heat-recovery-type refrigerating apparatus to cool an electrical equipment item.

However, when a refrigerant cooler is applied to a heat-recovery-type refrigerating apparatus, the flow rate of refrigerant flowing between the heat-source-side heat exchanger and the usage-side heat exchangers decreases when heat is recovered between the usage-side heat exchangers, and the flow rate of refrigerant flowing through the refrigerant cooler also consequently decreases. The electrical equipment item can therefore be inadequately cooled.

An object of the present invention is to configure a heat-recovery-type refrigerating apparatus capable of heat recovery between usage-side heat exchangers so that when a refrigerant cooler for cooling an electrical equipment item is provided thereto, the flow rate of refrigerant flowing through the refrigerant cooler is maintained, and an electrical equipment item can be cooled even when heat is being recovered between the usage-side heat exchangers.

A heat-recovery-type refrigerating apparatus according to a first aspect includes a compressor, heat-source-side heat exchanger, and a plurality of usage-side heat exchangers which can each individual) be switched between functioning as refrigerant evaporators or refrigerant radiators, refrigerant being sent from a usage-side heat exchanger functioning as a refrigerant radiator to a usage-side heat exchanger functioning as a refrigerant evaporator, whereby heat can he recovered between the usage-side heat exchangers. Here, a portion of the heat-source-side heat exchanger is configured as a precooling heat exchanger for always circulating high-pressure vapor refrigerant discharged from the compressor, and a refrigerant cooler for cooling an electrical equipment item is connected to a downstream side of the precooling heat exchanger.

In providing the refrigerant cooler for cooling the electrical equipment item herein, a configuration is adopted in which a portion of the heat-source-side heat exchanger is configured as a precooling heat exchanger for always circulating high-pressure vapor refrigerant discharged from the compressor, and a refrigerant cooler is connected to the downstream side of the precooling heat exchanger, as described above. It is therefore possible for refrigerant to always be circulated to the refrigerant cooler through the precooling, heat exchanger. The flow rate of refrigerant flowing through the refrigerant cooler is thereby maintained, and the electrical equipment item can be cooled during heat recovery between the usage-side heat exchangers, i.e., even when the flow rate of refrigerant flowing between the heat-source-side heat exchanger and the usage-side heat exchangers decreases.

A heat-recovery-type refrigerating apparatus according to a second aspect is the heat-recovery-type refrigerating apparatus according to the first aspect, wherein a refrigerant-cooling-side flow rate adjusting mechanism for adjusting a flow rate of refrigerant flowing through the precooling heat exchanger is connected to a downstream side of the refrigerant cooler.

Here, a configuration is adopted in which a refrigerant-cooling-side flow rate adjusting mechanism is connected to the downstream side of the refrigerant cooler, as described above. The flow rate of refrigerant flowing through the precooling heat exchanger, and consequently the flow rate of refrigerant flowing through the refrigerant cooler, can thereby be appropriately adjusted.

A heat-recovery-type refrigerating apparatus according to a third aspect is the heat-recovery-type refrigerating apparatus according to the second aspect, wherein a heat-source-side flow rate adjusting mechanism for adjusting the flow rate of refrigerant flowing through a main heat-source-side heat exchanger which is a portion of the heat-source-side heat exchanger excluding the precooling heat exchanger is connected to a liquid side of the main heat-source-side heat exchanger, and an outlet of the refrigerant-cooling-side flow rate adjusting mechanism is connected to a downstream side of the heat-source-side flow rate adjusting mechanism when the main heat-source-side heat exchanger is caused to function as refrigerant radiator.

Here, a configuration is adopted in which the outlet of the refrigerant-cooling-side flow rate adjusting mechanism for adjusting the flow rate of refrigerant flowing through the precooling heat exchanger and the refrigerant cooler is connected to the downstream side of the heat-source-side flow rate adjusting mechanism when the main heat-source-side heat exchanger functions as refrigerant radiator, as described above. The flow rate of refrigerant flowing through the main heat-source-side heat exchanger can thereby be adjusted by the heat-source-side flow rate adjusting mechanism, and separately from this adjustment, the flow rate of refrigerant flowing through the precooling heat exchanger and the refrigerant cooler can be adjusted by the refrigerant-cooling-side flow rate adjusting mechanism.

A heat-recovery-type refrigerating apparatus according to a fourth aspect is the heat-recovery-type refrigerating apparatus according to the third aspect, wherein: the main heat-source-side heat exchanger has a first heat-source-side heat exchanger and a second heat-source-side heat exchanger; the heat-source-side flow rate adjusting mechanism has a first heat-source-side flow rate adjusting mechanism for adjusting the flow rate of refrigerant flowing through the first heat-source-side heat exchanger, and a second heat-source-side flow rate adjusting mechanism for adjusting the flow rate of refrigerant flowing through the second heat-source-side heat exchanger. The outlet of the refrigerant-cooling-side flow rate adjusting mechanism is also connected to a downstream side of the first heat-source-side flow rate adjusting mechanism when the first heat-source-side heat exchanger is caused to function as a refrigerant radiator, and to a downstream side of the second heat-source-side flow rate adjusting mechanism when the second heat-source-side heat exchanger is caused to function as a refrigerant radiator.

Here, the main heat-source-side heat exchangers are first of all divided into a first heat-source-side heat exchanger and a second heat-source-side heat exchanger, and heat-source-side flow rate adjusting mechanisms are provided to the respective heat-source-side heat exchangers, as described above. The flow rates of refrigerant flowing through the heat-source-side heat exchangers can therefore be individually adjusted, and the heat-source-side heat exchangers can each individually be switched between functioning as a refrigerant evaporator or a refrigerant radiator. A configuration is also adopted in which the outlet of the refrigerant-cooling-side flow rate adjusting mechanism for adjusting the flow rate of refrigerant flowing through the precooling heat exchanger and the refrigerant cooler is connected to the downstream side of the heat-source-side flow rate adjusting mechanisms when the two heat-source-side heat exchangers function as refrigerant radiators, as described above. The flow rates of refrigerant flowing through the two heat-source-side heat exchangers can thereby be individually adjusted b the heat-source-side flow rate adjusting mechanisms, and separately from this adjustment, the flow rate of refrigerant flowing through the precooling heat exchanger and the refrigerant cooler can be adjusted by the refrigerant-cooling-side flow rate adjusting mechanism.

A heat-recovery-type refrigerating apparatus according to a fifth aspect is the heat-recovery-type refrigerating apparatus according to any of the first through fourth aspects, wherein the precooling heat exchanger constitutes a bottom part of the heat-source-side heat exchanger.

A heat-recovery-type refrigerating apparatus according to a sixth aspect is the heat-recovery-type refrigerating apparatus according to the fifth aspect, wherein the heat-source-side heat exchanger has a structure in which a plurality of refrigerant paths through which refrigerant flows in a horizontal direction are arranged in a plurality of levels in a vertical direction, and the precooling heat exchanger constitutes the refrigerant path on the lowermost level among the plurality of refrigerant paths.

Here, the precooling heat exchanger constitutes a bottom part of the heat-source-side heat exchanger as described above. For example, in a case in which the heat-source-side heat exchanger has a structure in which a plurality of refrigerant paths through which refrigerant flows in a horizontal direction are arranged in a plurality of levels in a vertical direction, the precooling heat exchanger constitutes the refrigerant path on the lowermost level among the plurality of refrigerant paths. Through this configuration, high-pressure vapor refrigerant discharged from the compressor is always circulated to the bottom part of the heat-source-side heat exchanger, and freezing of the bottom part of the heat-source-side heat exchanger can be suppressed.

DESCRIPTION OF EMBODIMENTS

Embodiments of the heat-recovery-type refrigerating apparatus according to the present invention are described below with reference to the drawings. The specific configuration of the heat-recovery-type refrigerating apparatus according to the present invention is not limited by the embodiments and modifications thereof described below, and can be modified within a range that does not depart from the gist of the invention.

(1) Configuration of a Heat-Recovery-Type Refrigerating Apparatus Simultaneous-Cooling/Heating-Operation-Type Air Conditioning Apparatus)

Figure 1:
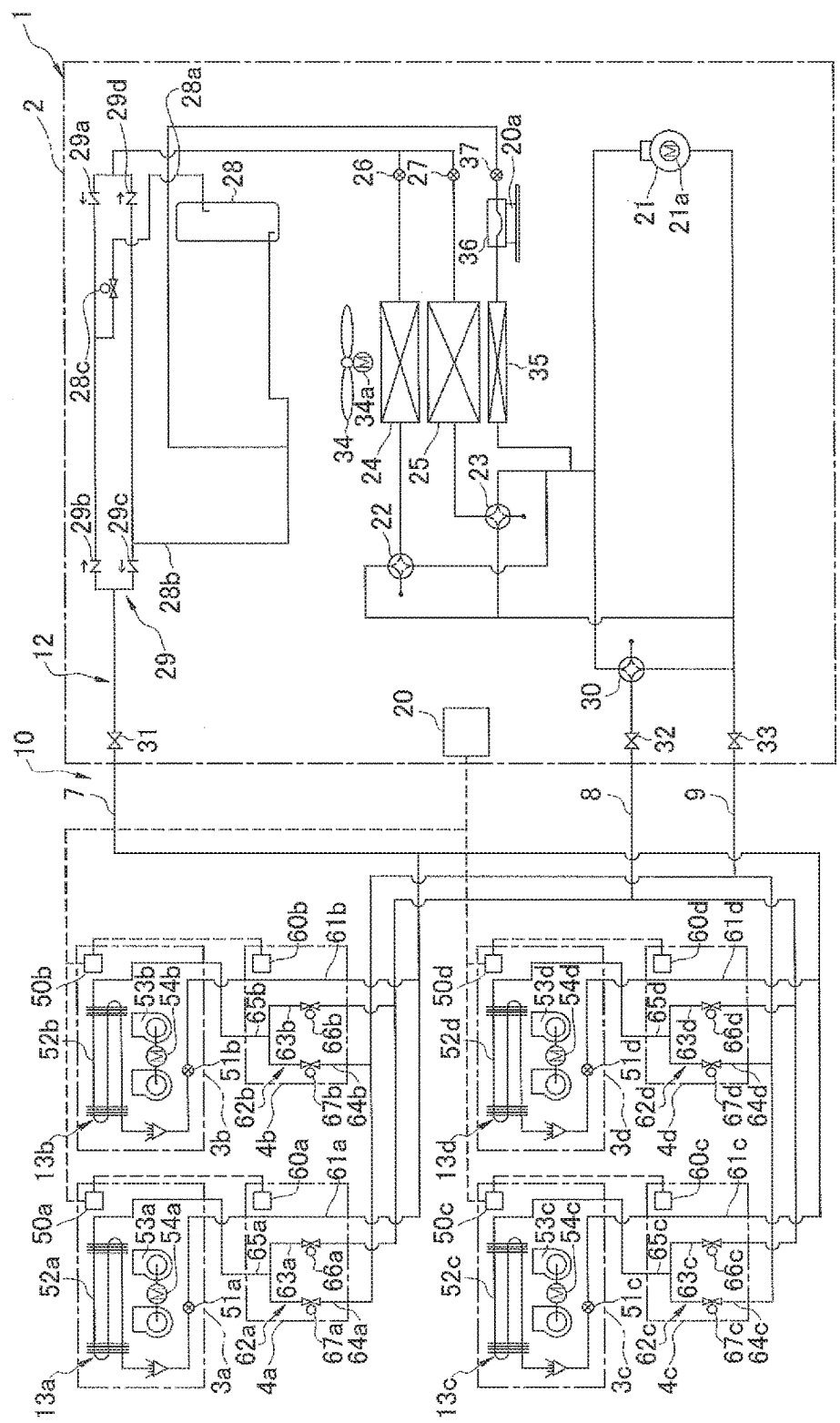
FIG. 1 is a schematic configuration diagram illustrating a simultaneous-cooling/heating-operation-type air conditioning apparatus as an embodiment of the heat-recovery-type refrigerating apparatus according to the present invention.
Figure 2:
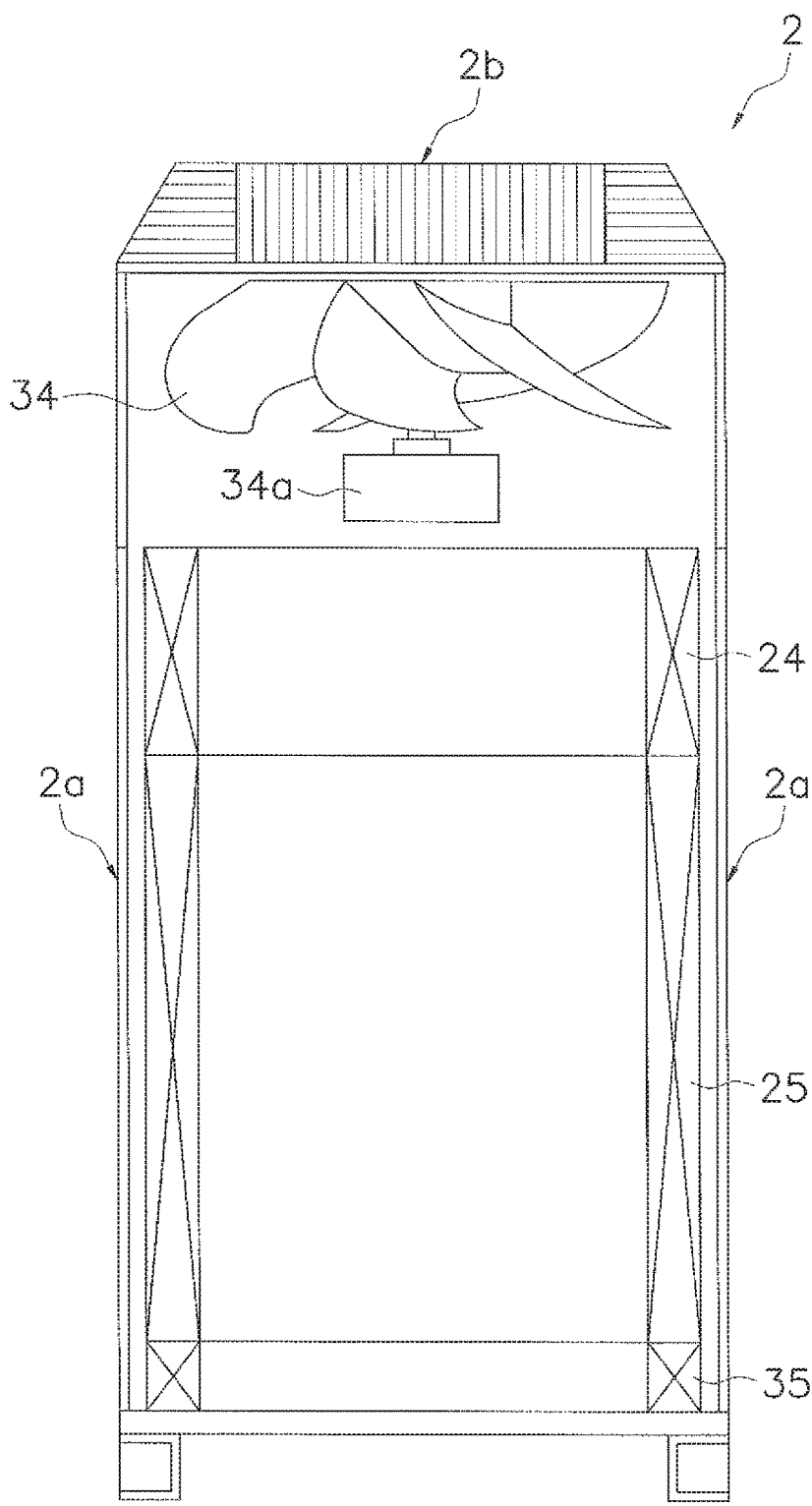
FIG. 2 is a view illustrating the general internal structure of a heat source unit constituting the simultaneous-cooling/heating-operation-type air conditioning apparatus.
Figure 3:
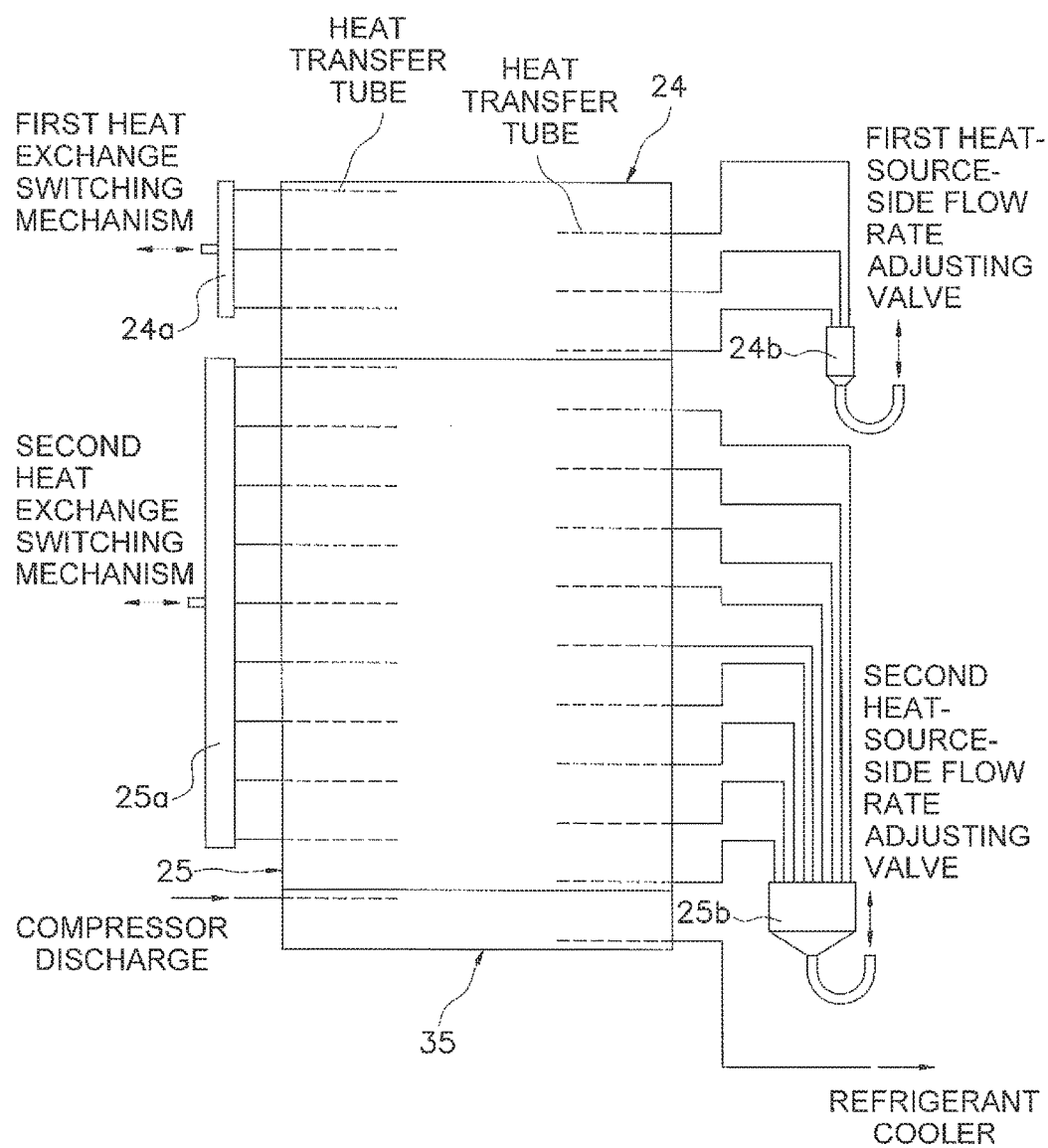
FIG. 3 is a view schematically illustrating the structure of a heat-source-side heat exchanger.

FIG. 1 is a schematic configuration diagram illustrating a simultaneous-cooling/heating-operation-type air conditioning apparatus 1 as an embodiment of the heat-recovery-type refrigerating apparatus according to the present invention. FIG. 2 is a view illustrating the general internal structure of a heat source unit 2 constituting the simultaneous-cooling/heating-operation-type air conditioning apparatus 1. FIG. 3 is a view schematically illustrating the structure of heat-source-side heat exchangers 24, 25, 35. The simultaneous-cooling/heating-operation-type air conditioning apparatus 1 is used for indoor air cooling/heating in a building or the like by performing a vapor-compression-type refrigerating cycle.

The simultaneous-cooling/heating-operation-type air conditioning apparatus 1 has primarily a single heat-source unit 2, a plurality of (four in this case) usage units 3a, 3b, 3c, 3d, connecting units 4a, 4b, 4c, 4d connected to the usage units 3a, 3b, 3c, 3d, and refrigerant communicating pipes 7, 8, 9 for connecting the heat-source unit 2 and the usage units 3a, 3b, 3c, 3d via the connecting units 4a, 4b, 4c, 4d. Specifically, a vapor-compression-type refrigerant circuit 10 of the simultaneous-cooling/heating-operation-type air conditioning apparatus 1 is configured by the connecting of the heat-source unit 2, the usage units 3a, 3b, 3c, 3d, the connecting units 4a, 4b, 4c, 4d, and the refrigerant communicating pipes 7, 8, 9. The simultaneous-cooling/heating-operation-type air conditioning apparatus 1 is also configured so that the usage units 3a, 3b, 3c, 3d can individually perform air-cooling operation or air-heating operation, and refrigerant is sent from a usage unit for performing air-heating operation to a usage unit for performing air-cooling operation, whereby heat can be recovered between the usage units (i.e., simultaneous cooling/heating operation can be performed in which air-cooling operation and air-heating operation are performed simultaneously). The simultaneous-cooling/heating-operation-type air conditioning apparatus 1 is also configured so that the heat load of the heat-source unit 2 is balanced in accordance with the overall heat load of the plurality of usage units 3a, 3b, 3c, 3d taking into account the heat recovery (simultaneous cooling/heating operation) described above.

<Usage Units>

The usage units 3a, 3b, 3c, 3d are installed by being built into or suspended from an indoor ceiling of a building or the like, by hanging on an indoor wall surface, or by other means. The usage units 3a, 3b, 3c, 3d are connected to the heat-source unit 2 via the refrigerant communicating pipes 7, 8, 9 and the connecting units 4a, 4b, 4c, 4d, and constitute a portion of the refrigerant circuit 10.

The configuration of the usage units 3a, 3b, 3c, 3d will next be described. The usage unit 3a and the usage units 3b, 3c, 3d have the same configuration. Therefore, only the configuration of the usage unit 3a will be described. To refer to the configuration of the usage units 3b, 3c, 3d, the subscripts "b," "c," and "d" are added instead of "a" to the reference signs for indicating the components of the usage unit 3a, and the components of the usage units 3b, 3c, 3d will not be described.

The usage unit 3a primarily constitutes a portion of the refrigerant circuit 10 and has a usage-side refrigerant circuit 13a (usage-side refrigerant circuits 13b, 13c, 13d in the usage units 3b, 3c, 3d, respectively). The usage-side refrigerant circuit 13a has primarily a usage-side flow rate adjusting valve 51a and a usage-side heat exchanger 52a.

The usage-side flow rate adjusting valve 51a is an electric expansion valve, the opening degree of which is adjustable, connected to a liquid side of the usage-side heat exchanger 52a in order to perform adjustment and the like of the flow rate of refrigerant flowing through the usage-side heat exchanger 52a.

The usage-side heat exchanger 52a is a device for exchanging heat between the refrigerant and indoor air, and comprises a fin-and-tube heat exchanger configured from a plurality of heat transfer tubes and fins, for example. Here, the usage unit 3a has an indoor fan 53a for drawing indoor air into the unit and supplying the air indoors as supply air after heat is exchanged, and is capable of causing heat to be exchanged between the indoor air and the refrigerant flowing through the usage-side heat exchanger 52a. The indoor fan 53a is driven by an indoor fan motor 54a.

The usage unit 3a has a usage-side control unit 50a for controlling the operation of the components 51a, 54a constituting the usage unit 3a. The usage-side controller 50a has a microcomputer and/or memory for controlling the usage unit 3a, and is configured so as to be capable of exchanging control signals and the like with a remote control (not shown), and exchanging control signals and the like with the heat source unit 2.

<Heat Source Unit>

The heat-source unit 2 is installed on the roof or elsewhere in a building or the like, is connected to the usage units 3a, 3b, 3c, 3d via the refrigerant communicating pipes 7, 8, 9, and constitutes the refrigerant circuit 10 with the usage units 3a, 3b, 3c, 3d.

The configuration of the heat-source unit 2 will next be described. The heat-source unit 2 primarily constitutes a portion of the refrigerant circuit 10 and has a heat-source-side refrigerant circuit 12. The heat-source-side refrigerant circuit 12 has primarily a compressor 21, a plurality of (two in this case) heat exchange switching mechanisms 22, 23, heat-source-side heat exchangers comprising two heat-source-side heat exchangers 24, 25 as main heat-source-side heat exchangers and a precooling heat exchanger 35, a refrigerant cooler 36, heat-source-side flow rate adjusting valves 26, 27 as heat-source-side flow rate adjusting mechanisms corresponding to the two heat-source-side heat exchangers 24, 25, a refrigerant-cooling-side flow rate adjusting valve 37 as a refrigerant-cooling-side flow rate adjusting mechanism corresponding to the precooling heat exchanger 35 and the refrigerant cooler 36, a receiver 28, abridge circuit 29, a high/low pressure switching mechanism 30, a liquid-side shutoff valve 31, a high/low-pressure-vapor-side shutoff valve 32, and a low-pressure-vapor-side shutoff valve 33.

The compressor 21 is a device for compressing the refrigerant, and comprises a scroll-type or other type of positive-displacement compressor capable of varying an operating capacity by inverter control of a compressor motor 21*a*, for example.

A first heat exchange switching mechanism 22 comprises a four-way switching valve, for example, and is a device capable of switching a flow path of refrigerant in the heat-source-side refrigerant circuit 12 so that a discharge side of the compressor 21 and a vapor side of a first heat-source-side heat exchanger 24 are connected (as indicated by solid lines in the first heat exchange switching mechanism 22 in FIG. 1) when the first heat-source-side heat exchanger 24 as a main heat-source-side heat exchanger is caused to function as a refrigerant radiator (referred to below as a "radiating operation state"), and an intake side of the compressor 21 and the vapor side of the first heat-source-side heat exchanger 24 are connected (as indicated by broken lines in the first heat exchange switching mechanism 22 in FIG. 1) when the first heat-source-side heat exchanger 24 is caused to function as a refrigerant evaporator (referred to below as an "evaporating operation state"). A second heat exchange switching mechanism 23 comprises a four-way switching valve, for example, and is a device capable of switching the flow path of refrigerant in the heat-source-side refrigerant circuit 12 so that the discharge side of the compressor 21 and a vapor side of a second heat-source-side heat exchanger 25 are connected (as indicated by solid lines in the second heat exchange switching mechanism 23 in FIG. 1) when the second heat-source-side heat exchanger 25 as a main heat-source-side heat exchanger is caused to function as a refrigerant radiator (referred to below as a "radiating operation state"), and the intake side of the compressor 21 and the vapor side of the second heat-source-side heat exchanger 25 are connected (as indicated by broken lines in the second heat exchange switching mechanism 23 in FIG. 1) when the second heat-source-side heat exchanger 25 is caused to function as a refrigerant evaporator (referred to below as an "evaporating operation state"). By changing the switching states of the first heat exchange switching mechanism 22 and the second heat exchange switching mechanism 23, the first heat-source-side heat exchanger 24 and the second heat-source-side heat exchanger 25 can each individually be switched between functioning as a refrigerant evaporator or a refrigerant radiator.

The first heat-source-side heat exchanger 24 as a main heat-source-side heat exchanger is a device for exchanging heat between the refrigerant and outdoor air, and comprises a fin-and-tube heat exchanger configured from a plurality of heat transfer tubes and fins, for example. The vapor side of the first heat-source-side heat exchanger 24 is connected to the first heat exchange switching mechanism 22, and the liquid side of the first heat-source-side heat exchanger 24 is connected to a first heat-source-side flow rate adjusting valve 26. Specifically, a first header 24*a* for merging and branching the refrigerant from and into the plurality of heat transfer tubes constituting the first heat-source-side heat exchanger 24 is provided to the vapor side of the first heat-source-side heat exchanger 24, and the first header 24*a* is connected to the first heat exchange switching mechanism 22. A first flow divider 24*b* for merging and branching the refrigerant from and into the plurality of heat transfer tubes constituting the first heat-source-side heat exchanger 24 is provided to the liquid side of the first heat-source-side heat exchanger 24, and the first flow divider 24*b* is connected to the first heat-source-side flow rate adjusting valve 26. The second heat-source-side heat exchanger 25 as a main heat-source-side heat exchanger is a device for exchanging heat between the refrigerant and outdoor air, and comprises a fin-and-tube heat exchanger configured from a plurality of heat transfer tubes and fins, for example. The vapor side of the second heat-source-side heat exchanger 25 is connected to the second heat exchange switching mechanism 23, and the liquid side of the second heat-source-side heat exchanger 25 is connected to a second heat-source-side flow rate adjusting valve 27. Specifically, a second header 25*a* for merging and branching the refrigerant from and into the plurality of heat transfer tubes constituting the second heat-source-side heat exchanger 25 is provided to the vapor side of the second heat-source-side heat exchanger 25, and the second header 25*a* is connected to the second heat exchange switching mechanism 23. A second flow divider 25*b* for merging and branching the refrigerant from and into the plurality of heat transfer tubes constituting the second heat-source-side heat exchanger 25 is provided to the liquid side of the second heat-source-side heat exchanger 25, and the second flow divider 25*b* is connected to the second heat-source-side flow rate adjusting valve 27.

The precooling heat exchanger 35 is a device for exchanging heat between the refrigerant and outdoor air, and comprises a fin-and-tube heat exchanger configured from a plurality of heat transfer tubes and fins, for example. The precooling heat exchanger 35 constitutes a portion of the heat-source-side heat exchangers (i.e., the portion of the heat-source-side heat exchangers excluding the heat-source-side heat exchangers 24, 25 as main heat-source-side heat exchangers), and is provided to the heat-source-side refrigerant circuit 12 so that high-pressure vapor refrigerant discharged from the compressor 21 is always circulated. Specifically, the precooling, heat exchanger 35 differs from the heat-source-side heat exchangers 24, 25 as main heat-source-side heat exchangers in not using a mechanism such as the heat exchange switching mechanisms 22, 23 for enabling switching between functioning as a refrigerant evaporator or radiator, and the vapor side of the precooling heat exchanger 35 is connected to the discharge side of the compressor 21. Specifically, unlike the heat-source-side heat exchangers 24, 25 as main heat-source-side heat exchangers, the precooling, heat exchanger 35 always functions as a refrigerant radiator.

Here, the precooling heat exchanger 35 constitutes a bottom part of the heat-source-side heat exchangers comprising the two heat-source-side heat exchangers 24, 25 as main heat-source-side heat exchangers and the precooling heat exchanger 35. Specifically, the precooling heat exchanger 35 is disposed on a bottom side of the heat-source-side heat exchangers 24, 25 as main heat-source-side heat exchangers. The first heat-source-side heat exchanger 24 is disposed on a top side of the second heat-source-side heat exchanger 25. Specifically, the first heat-source-side heat exchanger 24, the second heat-source-side heat exchanger 25, and the precooling heat exchanger 35 are configured as an integrated heat-source-side heat exchanger. Here, a configuration is adopted in which the heat-source-side heat exchangers 24, 25, 35 have a structure in which a plurality of refrigerant paths through which refrigerant flows in a horizontal direction are arranged in a plurality of levels in a vertical direction. A configuration is also adopted whereby the heat transfer tube constituting a top refrigerant path in the heat-source-side heat exchangers 24, 25, 35 between the plurality of refrigerant paths is connected to the first header 24*a* and the first flow divider 24*b*, and thereby functions as the first heat-source-side heat exchanger 24, the heat transfer tube constituting a middle refrigerant path is connected to a second header 25*a* and a second flow divider 25b, and thereby functions as the second heat-source-side heat exchanger 25, and the heat transfer tube constituting the refrigerant path on the lowermost level functions as the precooling heat exchanger 35.

The heat-source unit 2 has an outdoor fan 34 for drawing outdoor air into the unit and discharging the air from the unit after heat is exchanged, and is capable of causing heat to be exchanged between the outdoor air and the refrigerant flowing through the heat-source-side heat exchangers 24, 25, 35. The outdoor fan 34 is driven by an outdoor fan motor 34a. An intake port 2a for drawing in outdoor air is formed in a side surface of the heat-source unit 2, a vent 2b for discharging outdoor air is formed in atop surface of the heat-source unit 2, and the outdoor fan 34 is disposed in a top part of the heat-source unit 2.

The refrigerant cooler 36 is a device for cooling an electrical equipment item 20a by heat exchange between the electrical equipment item 20a and refrigerant radiated in the precooling heat exchanger 35, and is connected to a liquid side of the precooling heat exchanger 35, i.e., a downstream side of the precooling heat exchanger 35. The refrigerant cooler 36 is configured by bringing a metal member in which a refrigerant flow path is formed into contact with the electrical equipment item 20a. Here, the electrical equipment item 20a is an electric component for controlling the components constituting the heat-source unit 2, and constitutes a heat-source-side control part 20 described below A power element constituting an inverter for controlling the compressor motor 21a and/or a reactor or other high-heat-generating electric component are cited as examples of electrical equipment items 20a which must be cooled by the refrigerant cooler 36. Such a high-heat-generating electric component tends to generate a larger amount of heat as the operating capacity of the compressor 21 becomes larger. In FIG. 1, the electrical equipment item 20a is illustrated as being separate from the heat-source-side control part 20, but this is done for convenience in explaining the function of the refrigerant cooler 36.

The first heat-source-side flow rate adjusting valve 26 as a heat-source-side flow rate adjusting mechanism is an electric expansion valve, the opening degree of which is adjustable, connected to the liquid side of the first heat-source-side heat exchanger 24 in order to perform adjustment and the like of the flow rate of refrigerant flowing through the first heat-source-side heat exchanger 24. A second heat-source-side flow rate adjusting valve 27 as a heat-source-side flow rate adjusting mechanism is an electric expansion valve, the opening degree of which is adjustable, connected to the liquid side of the second heat-source-side heat exchanger 25 in order to perform adjustment and the like of the flow rate of refrigerant flowing through the second heat-source-side heat exchanger 25. Specifically, the heat-source-side flow rate adjusting valves 26, 27 for adjusting the flow rate of refrigerant flowing through the heat-source-side heat exchangers 24, 25, which are the main heat-source-side heat exchangers constituting the portion of the heat-source-side heat exchangers 24, 25, 35 excluding the precooling heat exchanger 35, are connected to the liquid sides of the heat-source-side heat exchangers 24, 25, respectively.

The refrigerant-cooling-side flow rate adjusting valve 37 as a refrigerant-cooling-side flow rate adjusting mechanism is an electric expansion valve, the opening degree of which is adjustable, connected to a downstream side of the refrigerant cooler 36 in order to perform adjustment and the like of the flow rate of refrigerant flowing through the precooling heat exchanger 35 and the refrigerant cooler 36. An outlet of the refrigerant-cooling-side flow rate adjusting valve 37 is connected to a downstream side of the heat-source-side flow rate adjusting valves 26, 27 when the heat-source-side heat exchangers 24, 25 as main heat-source-side heat exchangers are caused to function as refrigerant radiators, i.e., to the downstream side of the first heat-source-side flow rate adjusting valve 26 when the first heat-source-side heat exchanger 24 is caused to function as a refrigerant radiator, and to the downstream side of the second heat-source-side flow rate adjusting valve 27 when the second heat-source-side heat exchanger 25 is caused to function as a refrigerant radiator. Here, the outlet of the refrigerant-cooling-side flow rate adjusting valve 37 is connected so as to merge with an outlet pipe 28b of the receiver 28.

The receiver 28 is a container for temporarily collecting the refrigerant flowing between the heat-source-side heat exchangers 24, 25 and the usage-side refrigerant circuits 13a, 13b, 13c, 13d. A receiver inlet pipe 28a is provided to a top part of the receiver 28, and the receiver outlet pipe 28b is provided to a bottom part of the receiver 28. A receiver inlet opening/closing valve 28c, the opening and closing of which can be controlled, is provided to the receiver inlet pipe 28a. The receiver inlet pipe 28a and the receiver outlet pipe 28b of the receiver 28 are connected between the liquid-side shutoff valve 31 and the heat-source-side heat exchangers 24, 25 via the bridge circuit 29.

The bridge circuit 29 is a circuit having a function for causing refrigerant to flow into the receiver 28 through the receiver inlet pipe 28a and causing refrigerant to flow out from the receiver 28 through the receiver outlet pipe 28b when refrigerant flows toward the liquid-side shutoff valve 31 from the heat-source-side heat exchangers 24, 25, as well as when refrigerant flows toward the heat-source-side heat exchangers 24, 25 from the liquid-side shutoff valve 31. The bridge circuit 29 has four check valves 29a, 29b, 29c, 29d. An inlet check valve 29a is a check valve for allowing refrigerant to circulate only from the heat-source-side heat exchangers 24, 25 to the receiver inlet pipe 28a. An inlet check valve 29b is a check valve for allowing refrigerant to circulate only from the liquid-side shutoff valve 31 to the receiver inlet pipe 28a. Specifically, the inlet check valves 29a, 29b have a function for causing refrigerant to circulate from the heat-source-side heat exchangers 24, 25 or the liquid-side shutoff valve 31 to the receiver inlet pipe 28a. An outlet check valve 29c is a check valve for allowing refrigerant to circulate only from the receiver outlet pipe 28b to the liquid-side shutoff valve 31. An outlet check valve 29d is a check valve for allowing refrigerant to circulate only from the receiver outlet pipe 28b to the heat-source-side heat exchangers 24, 25. Specifically, the outlet check valves 29c, 29d have a function for causing refrigerant to circulate from the receiver outlet pipe 28b to the heat-source-side heat exchangers 24, 25 or the liquid-side shutoff valve 31.

The high/low pressure switching mechanism 30 comprises a four-way switching valve, for example, and is a device capable of switching the flow path of refrigerant in the heat-source-side refrigerant circuit 12 so that the high/low-pressure-vapor-side shutoff valve 32 and the discharge side of the compressor 21 are connected (as indicated by broken lines in the high/low pressure switching mechanism 30 in FIG. 1) when high-pressure vapor refrigerant discharged from the compressor 21 is sent to the usage-side refrigerant circuits 13a, 13b, 13c, 13d (referred to below as a "mainly-radiation-load operation state"), and the high/low-pressure-vapor-side shutoff valve 32 and the intake side of the compressor 21 are connected (as indicated by solid lines in the high/low pressure switching mechanism 30 in FIG. 1)

when high-pressure vapor refrigerant discharged from the compressor 21 is not sent to the usage-side refrigerant circuits 13a, 13b, 13c, 13d (referred to below as a "mainly-evaporation-load operation state").

The liquid-side shutoff valve 31, the high/low-pressure-vapor-side shutoff valve 32, and the low-pressure-vapor-side shutoff valve 33 are valves provided to a port for connection with an external device/duct (specifically, the refrigerant communicating pipes 7, 8, 9). The liquid-side shutoff valve 31 is connected to the receiver inlet pipe 28a or the receiver outlet pipe 28b via the bridge circuit 29. The high/low-pressure-vapor-side shutoff valve 32 is connected to the high/low pressure switching mechanism 30. The low-pressure-vapor-side shutoff valve 33 is connected to the intake side of the compressor 21.

The heat-source unit 2 has the heat-source-side control part 20 for controlling the operation of the components 21a, 22, 23, 26, 27, 28c, 30, 34a, 37 constituting the heat-source unit 2. The heat-source-side control part 20 has a microcomputer and/or memory, an inverter, and the like provided to control the heat-source unit 2, and is configured so as to be capable of exchanging control signals and the like with the usage-side control parts 50a, 50b, 50c, 50d of the usage units 3a, 3b, 3c, 3d.

<Connecting Units>

The connecting units 4a, 4b, 4c, 4d are provided together with the usage units 3a, 3b, 3c, 3d inside a building or the like. The connecting units 4a, 4b, 4c, 4d are interposed between usage units 3, 4, 5 and the heat-source unit 2 together with refrigerant communicating pipes 7, 8, 9, and constitute a portion of the refrigerant circuit 10.

The configuration of the connecting units 4a, 4b, 4c, 4d will next be described. The connecting unit 4a and the connecting units 4b, 4c, 4d have the same configuration. Therefore, only the configuration of the connecting unit 4a will be described. To refer to the configuration of the connecting units 4b, 4c, 4d, the subscripts "b," "c," and "d" are added instead of "a" to the reference signs for indicating the components of the connecting unit 4a, and the components of the connecting units 4b, 4c, 4d will not be described.

The connecting unit 4a primarily constitutes a portion of the refrigerant circuit 10 and has a connection-side refrigerant circuit 14a (connection-side refrigerant circuit 14b, 14c, 14d in the connecting units 4b, 4c, 4d, respectively). The connection-side refrigerant circuit 14a has primarily a liquid connecting pipe 61a and a vapor connecting pipe 62a.

The liquid connecting pipe 61a connects the liquid refrigerant communicating pipe 7 and the usage-side flow rate adjusting valve 51a of the usage-side refrigerant circuit 13a.

The vapor connecting pipe 62a has a high-pressure vapor connecting pipe 63a connected to the high/low-pressure vapor refrigerant communicating pipe 8, a low-pressure vapor connecting pipe 64a connected to the low-pressure vapor refrigerant communicating pipe 9, and a merging vapor connecting pipe 65a for merging the high-pressure vapor connecting pipe 63a and the low-pressure vapor connecting pipe 64a. The merging vapor connecting pipe 65a is connected to the vapor side of the usage-side heat exchanger 52a of the usage-side refrigerant circuit 13a. A high-pressure vapor opening/closing valve 66a, the opening and closing of which can be controlled, is provided to the high-pressure vapor connecting pipe 63a, and a low-pressure vapor opening/closing valve 67a, the opening and closing of which can be controlled, is provided to the low-pressure vapor connecting pipe 64a.

During air-cooling operation by the usage unit 3a, the connecting unit 4a can function on that the low-pressure vapor opening/closing valve 67a is placed in an open state, refrigerant flowing into the liquid connecting pipe 61a through the liquid refrigerant communicating pipe 7 is sent to the usage-side heat exchanger 52a through the usage-side flow rate adjusting valve 51a of the usage-side refrigerant circuit 13a, and refrigerant evaporated by heat exchange with indoor air in the usage-side heat exchanger 52a is returned to the low-pressure vapor refrigerant communicating pipe 9 through the merging vapor connecting pipe 65a and the low-pressure vapor connecting pipe 64a. During air-heating operation by the usage unit 3a, the connecting unit 4a can function so that the low-pressure vapor opening/closing valve 67a is closed and the high-pressure vapor opening/closing valve 66a is placed in an open state, refrigerant flowing into the high-pressure vapor connecting pipe 63a and the merging vapor connecting pipe 65a through the high/low-pressure vapor refrigerant communicating pipe 8 is sent to the usage-side heat exchanger 52a of the usage-side refrigerant circuit 13a, and refrigerant radiated by heat exchange with indoor air in the usage-side heat exchanger 52a is returned to the liquid refrigerant communicating pipe 7 through the usage-side flow rate adjusting valve 51a and the liquid connecting pipe 61a. This function is performed not only by the connecting unit 4a, but also by the connecting units 4b, 4c, 4d in the same manner, and the usage-side heat exchangers 52a, 52b, 52c, 52d can therefore each individually be switched between functioning as refrigerant evaporators or refrigerant radiators by the connecting units 4a, 4b, 4c, 4d.

The connecting unit 4a has a connection-side control part 60a for controlling the operation of the components 66a, 67a constituting the connecting unit 4a. The connection-side control part 60a has a microcomputer and/or memory provided to control the connecting unit 4a, and is configured so as to be capable of exchanging control signals and the like with the usage-side control unit 50a of the usage unit 3a.

The usage-side refrigerant circuits 13a, 13b, 13c, 13d, the heat-source-side refrigerant circuit 12, the refrigerant communication pipes 7, 8, 9, and the connection-side refrigerant circuits 14a, 14b, 14c, 14d are connected as described above to configure the refrigerant circuit 10 of the simultaneous-cooling/heating-operation-type air conditioning apparatus 1. The simultaneous-cooling/heating-operation-type air conditioning apparatus 1 is also configured so as to be capable of simultaneous cooling/heating operation in which the usage units 3c, 3d perform air-heating operation while the usage units 3a, 3b perform air-cooling operation, for example. At this time, refrigerant is sent from the usage-side heat exchangers 52a, 52b functioning as refrigerant radiators to the usage-side heat exchangers 52c, 52d functioning as refrigerant evaporators, whereby heat is recovered between the usage units 3a, 3b, 3c, 3d. Specifically, the simultaneous-cooling/heating-operation-type air conditioning apparatus 1 includes a compressor 21, heat-source-side heat exchangers 24, 25, 35, and a plurality of (four in this case) usage-side heat exchangers 52a, 52b, 52c, 52d which can each individually be switched between functioning as refrigerant evaporators or refrigerant radiators, and is configured as a heat-recovery-type refrigerating apparatus in which refrigerant is sent from a usage-side heat exchanger functioning as a refrigerant radiator to a usage-side heat exchanger functioning as a refrigerant evaporator, whereby heat can be recovered between the usage-side heat exchangers. A configuration is also adopted herein whereby a portion of the heat-source-side heat exchangers 24, 25, 35 is configured as the precooling heat exchanger 35 for always circulating high-pressure vapor refrigerant discharged from the compressor 21, and the refrigerant cooler 36 for cooling the electrical equipment item 20a is connected to a downstream side of the precooling heat exchanger 35, as described above.

(2) Operation of the Heat-Recovery-Type Refrigerating Apparatus (Simultaneous-Cooling/Heating-Operation-Type Air Conditioning Apparatus)

The operation of the simultaneous-cooling/heating-operation-type air conditioning apparatus 1 will next be described.

Operation modes of the simultaneous-cooling/heating-operation-type air conditioning apparatus 1 can be divided into an air-cooling operation mode (large evaporation load), an air-cooling operation mode (small evaporation load), an air-heating operation mode (large radiation load), an air-heating operation mode (small radiation load), a simultaneous cooling/heating operation mode (mainly evaporation load), a simultaneous cooling/heating operation mode (mainly radiation load), a simultaneous cooling/heating operation mode (when the evaporation/radiation loads are balanced and refrigerant is circulated to the heat-source-side heat exchangers 24, 25), and a simultaneous cooling/heating operation mode (when the evaporation/radiation loads are balanced and refrigerant is not circulated to the heat-source-side heat exchangers 24, 25). Here, the air-cooling operation mode (large evaporation load) is an operation mode in which only usage units performing air-cooling operation (i.e., operation in which a usage-side heat exchanger functions as a refrigerant evaporator) are present, and both of the heat-source-side heat exchangers 24, 25 as main heat-source-side heat exchangers are caused to function as refrigerant radiators for the overall evaporation load of the usage units. The air-cooling operation mode (small evaporation load) is an operation mode in which only usage units performing air-cooling operation (i.e., operation in which a usage-side heat exchanger functions as a refrigerant evaporator) are present, and only the first heat-source-side heat exchanger 24 as a main heat-source-side heat exchanger is caused to function as a refrigerant radiator for the overall evaporation load of the usage units. The air-heating operation mode (large radiation load) is an operation mode in which only usage units performing air-heating operation (i.e., operation in which a usage-side heat exchanger functions as a refrigerant radiator) are present, and both of the heat-source-side heat exchangers 24, 25 as main heat-source-side heat exchangers are caused to function as refrigerant evaporators for the overall radiation load of the usage units. The air-heating operation mode (small radiation load) is an operation mode in which only usage units performing air-heating operation (i.e., operation in which a usage-side heat exchanger functions as a refrigerant radiator) are present, and only the first heat-source-side heat exchanger 24 as a main heat-source-side heat exchanger is caused to function as a refrigerant evaporator for the overall radiation load of the usage units. The simultaneous cooling/heating operation mode (mainly evaporation load is an operation mode in which only the first heat-source-side heat exchanger 24 as a main heat-source-side heat exchanger is caused to function as a refrigerant radiator for the overall evaporation load of the usage units when there is a mixture of usage units performing air-cooling operation (i.e., operation in which a usage-side heat exchanger functions as a refrigerant evaporator) and usage units performing air-heating operation (i.e., operation in which a usage-side heat exchanger functions as a refrigerant radiator), and the overall heat load of the usage units is mainly an evaporation load. The simultaneous cooling/heating operation mode (mainly radiation load) is an operation mode in which only the first heat-source-side heat exchanger 24 as a main heat-source-side heat exchanger is caused to function as a refrigerant evaporator for the overall radiation load of the usage units when there is a mixture of usage units performing air-cooling operation (i.e., operation in which a usage-side heat exchanger functions as a refrigerant evaporator) and usage units performing air-heating operation (i.e., operation in which a usage-side heat exchanger functions as a refrigerant radiator), and the overall heat load of the usage units is mainly a radiation load. The simultaneous cooling/heating operation mode (when the evaporation/radiation loads are balanced and refrigerant is circulated to the heat-source-side heat exchangers 24, 25) is an operation mode in which the first heat-source-side heat exchanger 24 as a main heat-source-side heat exchanger is caused to function as a refrigerant radiator and the second heat-source-side heat exchanger 25 as a main heat-source-side heat exchanger is caused to function as a refrigerant evaporator when there is a mixture of usage units performing air-cooling operation (i.e., operation in which a usage-side heat exchanger functions as a refrigerant evaporator) and usage units performing air-heating operation (i.e., operation in which a usage-side heat exchanger functions as a refrigerant radiator), and the overall evaporation load and radiation load of the usage units are balanced. The simultaneous cooling/heating operation mode (when the evaporation/radiation loads are balanced and refrigerant is not circulated to the heat-source-side heat exchangers 24, 25) is an operation mode in which refrigerant is not circulated to both the first heat-source-side heat exchanger 24 and the second heat-source-side heat exchanger 25 as main heat-source-side heat exchangers when there is a mixture of usage units performing air-cooling operation (i.e., operation in which a usage-side heat exchanger functions as a refrigerant evaporator) and usage units performing air-heating operation (i.e., operation in which a usage-side heat exchanger functions as a refrigerant radiator), and the overall evaporation load and radiation load of the usage units are balanced.

The operation of the simultaneous-cooling/heating-operation-type air conditioning apparatus 1 including these operation modes is performed by the control parts 20, 50a, 50b, 50c, 50d, 60a, 60b, 60c, 60d described above.

<Air-Cooling Operation Mode (Large Evaporation Load)>

Figure 4:
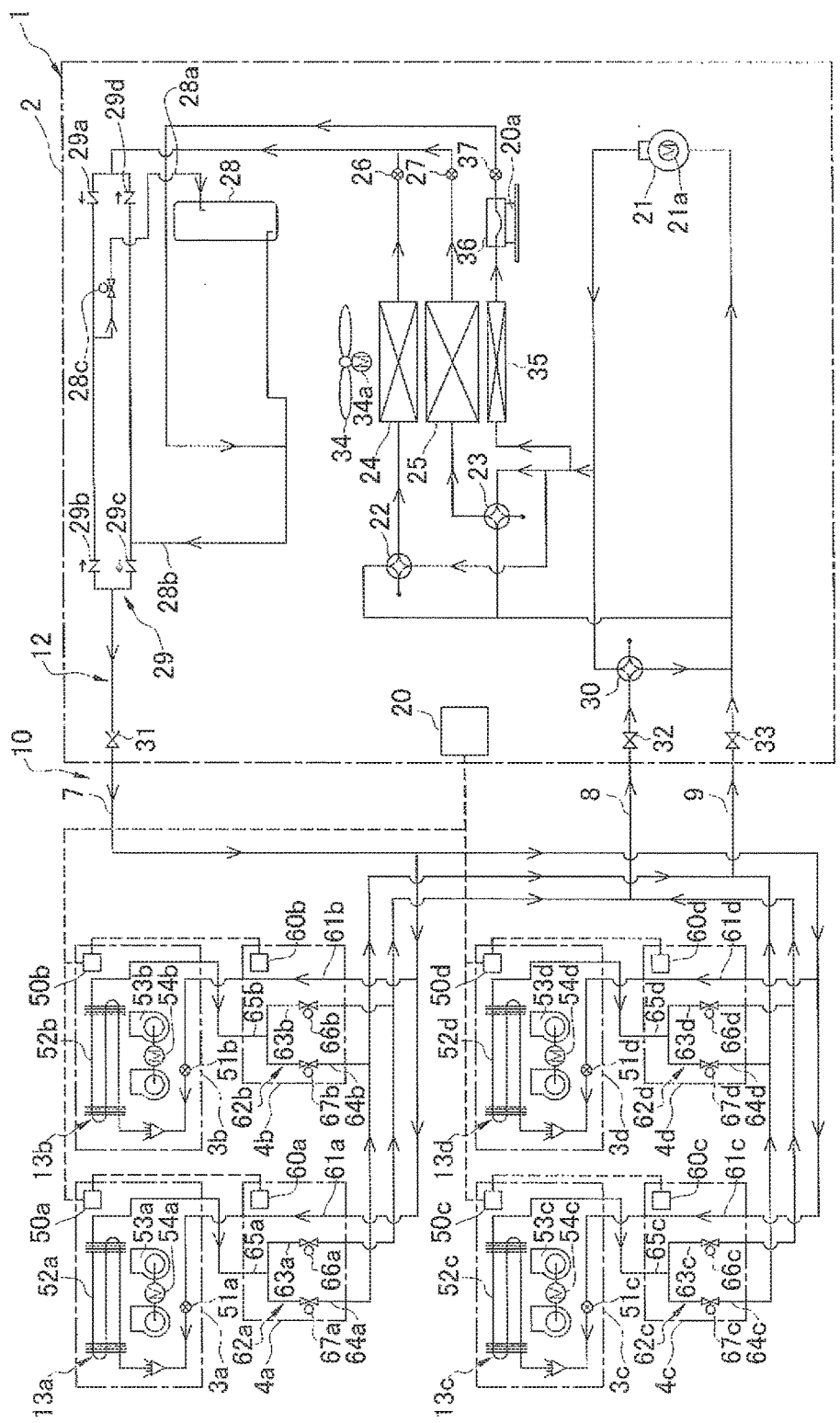
FIG. 4 is a view illustrating operation (refrigerant flow) in an air-cooling operation mode (large evaporation load) of the simultaneous-cooling/heating-operation-type air conditioning apparatus.

In the air-cooling operation mode (large evaporation load), e.g., when all of the usage units 3a, 3b, 3c, 3d are performing air-cooling operation (i.e., operation in which all of the usage-side heat exchangers 52a, 52b, 52c, 52d function as refrigerant evaporators) and both of the heat-source-side heat exchangers 24, 25 as main heat-source-side heat exchangers function as refrigerant radiators, the refrigerant circuit 10 of the air conditioning apparatus 1 is configured as illustrated in FIG. 4 (the flow of refrigerant being illustrated by arrows drawn in the refrigerant circuit 10 in FIG. 4).

Specifically, in the heat-source unit 2, the first heat exchange switching mechanism 22 is switched to a radiating operation state (indicated by solid lines in the first heat exchange switching mechanism 22 in FIG. 4) and the second heat exchange switching mechanism 23 is switched to a radiating operation state (indicated by solid lines in the second heat exchange switching mechanism 23 in FIG. 4), whereby both of the heat-source-side heat exchangers 24, 25 are caused to function as refrigerant radiators. The high/low pressure switching mechanism 30 is also switched to a mainly-evaporation-load operation state (indicated by solid lines in the high/low pressure switching mechanism 30 in FIG. 4). The opening degrees of the heat-source-side flow rate adjusting valves 26, 27 are also adjusted, and the receiver inlet opening/closing valve 28c is open. Furthermore, the opening degree of the refrigerant-cooling-side flow rate adjusting valve 37 is adjusted, and high-pressure vapor refrigerant discharged from the compressor 21 flows to the precooling heat exchanger 35. In the connecting units 4a, 4b, 4c, 4d, the high-pressure vapor opening/closing valves 66a, 66b, 66c, 66d and the low-pressure vapor opening/closing valves 67a, 67b, 67c, 67d are placed in the open state, whereby all of the usage-side heat exchangers 52a, 52b, 52c, 52d of the usage units 3a, 3b, 3c, 3d are caused to function as refrigerant evaporators, and all of the usage-side heat exchangers 52b, 52c, 52d of the usage units 3a, 3b, 3c, 3d and the intake side of the compressor 21 of the heat-source unit 2 are connected via the high/low-pressure vapor refrigerant communicating pipe 8 and the low-pressure vapor refrigerant communicating pipe 9. In the usage units 3a, 3b, 3c, 3d, the opening degrees of the usage-side flow rate adjusting valves 51a, 51b, 51c, 51d are adjusted.

In the refrigerant circuit 10 thus configured, high-pressure vapor refrigerant compressed and discharged by the compressor 21 is sent to both of the heat-source-side heat exchangers 24, 25 as main heat-source-side heat exchangers through the heat exchange switching mechanisms 22, 23. The high-pressure vapor refrigerant compressed and discharged by the compressor 21 is also sent to the precooling heat exchanger 35. The high-pressure vapor refrigerant sent to the heat-source-side heat exchangers 24, 25 is then radiated in the heat-source-side heat exchangers 24, 25 by heat exchange with outdoor air supplied as a heat source by the outdoor fan 34. After the refrigerant is radiated in the heat-source-side heat exchangers 24, 25, and the flow rate is adjusted in the heat-source-side flow rate adjusting valves 26, 27, the refrigerant is merged and sent to the receiver 28 through the inlet check valve 29a and the receiver inlet opening/closing valve 28c. The high-pressure vapor refrigerant sent to the precooling heat exchanger 35 is also radiated in the precooling heat exchanger 35 by heat exchange with outdoor air supplied as a heat source by the outdoor fan 34. The refrigerant radiated in the precooling heat exchanger 35 is then sent to the refrigerant cooler 36, and cools the electrical equipment item 20a. After the refrigerant passed through the refrigerant cooler 36, and the flow rate is adjusted in the refrigerant-cooling-side flow rate adjusting valve 37, the refrigerant is sent to the receiver outlet pipe 28b. The refrigerant sent to the receiver 28 from the heat-source-side heat exchangers 24, 25 is temporarily collected in the receiver 28, then merged in the receiver outlet pipe 28b with the refrigerant passed through the refrigerant cooler 36, and the refrigerant is sent to the liquid refrigerant communicating pipe 7 through the outlet check valve 29c and the liquid-side shutoff valve 31.

The refrigerant sent to the liquid refrigerant communicating pipe 7 is branched into four streams and sent to the liquid connecting pipes 61a, 61b, 61c, 61d of the connecting units 4a, 4b, 4c, 4d. The refrigerant sent to the liquid connecting pipes 61a, 61b, 61c, 61d is then sent to the usage-side flow rate adjusting valves 51a, 51b, 51c, 51d of the usage units 3a, 3b, 3c, 3d.

After the refrigerant is sent to the usage-side flow rate adjusting valves 51a, 51b, 51c, 51d, and the flow rate is adjusted in the usage-side flow rate adjusting valves 51a, 51b, 51c, 51d, the refrigerant is evaporated in the usage-side heat exchangers 52a, 52b, 52c, 52d by heat exchange with indoor air supplied by the indoor fans 53a, 53b, 53c, 53d, and becomes low-pressure vapor refrigerant. Meanwhile, the indoor air is cooled and supplied indoors, and air-cooling operation by the usage units 3a, 3b, 3c, 3d is performed. The low-pressure vapor refrigerant is then sent to the merging vapor connecting pipes 65a, 65b, 65c, 65d of the connecting units 4a, 4b, 4c, 4d.

The low-pressure vapor refrigerant sent to the merging vapor connecting pipes 65a, 65b, 65c, 65d is then sent to the high/low-pressure vapor refrigerant communicating pipe 8 through the high-pressure vapor opening/closing valves 66a, 66b, 66c, 66d and the high-pressure vapor connecting pipes 63a, 63b, 63c, 63d and merged, and also sent to the low-pressure vapor refrigerant communicating pipe 9 through the low-pressure vapor opening/closing valves 67a, 67b, 67c, 67d and the low-pressure vapor connecting pipes 64a, 64b, 64c, 64d and merged.

The low-pressure vapor refrigerant sent to the vapor refrigerant communicating pipes 8, 9 is then returned to the intake side of the compressor 21 through the vapor-side shutoff valves 32, 33 and the high/low pressure switching mechanism 30.

Operation in the air-cooling operation mode (large evaporation load) is performed in the manner described above. In the air-cooling operation mode (large evaporation load), it is possible for refrigerant to always be circulated to the refrigerant cooler 36 through the precooling heat exchanger 35, as described above. It is thereby possible to maintain the flow rate of refrigerant flowing through the refrigerant cooler 36 and cool the electrical equipment item 20a in the air-cooling operation mode (large evaporation load).

<Air-Cooling Operation Mode (Small Evaporation Load)>

Figure 5:
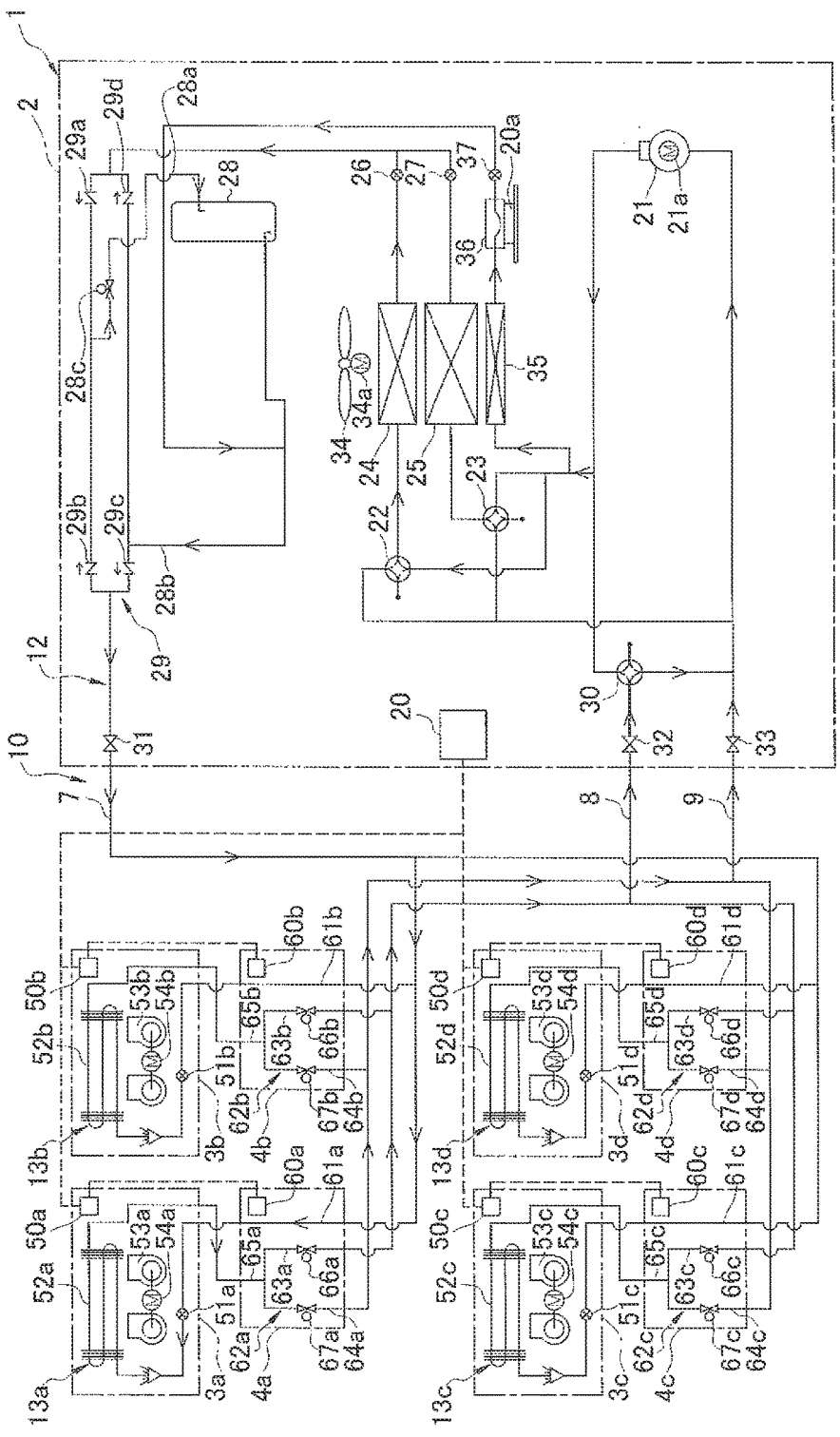
FIG. 5 is a view illustrating operation (refrigerant flow) in an air-cooling operation mode (small evaporation load) of the simultaneous-cooling/heating-operation-type air conditioning apparatus.

In the air-cooling operation mode (small evaporation load), e.g., when only the usage unit 3a is performing air-cooling operation (i.e., operation in which only the usage-side heat exchanger 52a functions as a refrigerant evaporator) and only the first heat-source-side heat exchanger 24 as a main heat-source-side heat exchanger functions as a refrigerant radiator, the refrigerant circuit 10 of the air conditioning apparatus 1 is configured as illustrated in FIG. 5 (the flow of refrigerant being illustrated by arrows drawn in the refrigerant circuit 10 in FIG. 5).

Specifically, in the heat-source unit 2, the first heat exchange switching mechanism 22 is switched to the radiating operation state (indicated by solid lines in the first heat exchange switching mechanism 22 in FIG. 5), whereby only the first heat-source-side heat exchanger 24 is caused to function as a refrigerant radiator. The high/low pressure switching mechanism 30 is also switched to a mainly-evaporation-load operation state (indicated by solid lines in the high/low pressure switching mechanism 30 in FIG. 5). The opening degree of the first heat-source-side flow rate adjusting valve 26 is also adjusted, the second heat-source-side flow rate adjusting valve 27 is closed, and the receiver inlet opening/closing valve 28c is open. Furthermore, the opening degree of the refrigerant-cooling-side flow rate adjusting valve 37 is adjusted, and high-pressure vapor refrigerant discharged from the compressor 21 flows to the precooling heat exchanger 35. In the connecting units 4a, 4b, 4c, 4d, the high-pressure vapor opening/closing valve 66a and the low-pressure vapor opening/closing valve 67a are placed in the open state and the high-pressure vapor opening/closing valves 66b, 66c, 66d and the low-pressure vapor opening/closing valves 67b, 67c, 67d are placed in the closed state, whereby only the usage-side heat exchanger 52a of the usage unit 3a is caused to function as a refrigerant evaporator, and the usage-side heat exchanger 52a of the usage unit 3a and the intake side of the compressor 21 of the heat-source unit 2 are connected via the high/low-pressure vapor refrigerant communicating pipe 8 and the low-pressure vapor refrigerant communicating pipe 9. The opening degree of the usage-side flow rate adjusting valve 51a in the usage unit 3a is adjusted, and the usage-side flow rate adjusting valves 51b, 51c, 51d in the usage units 3b, 3c, 3d are closed.

In the refrigerant circuit 10 thus configured, high-pressure vapor refrigerant compressed and discharged by the compressor 21 is sent to the first heat-source-side heat exchanger 24 as a main heat-source-side heat exchanger through the first heat exchange switching mechanism 22. The high-pressure vapor refrigerant compressed and discharged by the compressor 21 is also sent to the precooling heat exchanger 35. The high-pressure vapor refrigerant sent to the first heat-source-side heat exchanger 24 is then radiated in the first heat-source-side heat exchanger 24 by heat exchange with outdoor air supplied as a heat source by the outdoor fan 34. After the refrigerant is radiated in the first heat-source-side heat exchanger 24, and the flow rate is adjusted in the first heat-source-side flow rate adjusting valve 26, the refrigerant is sent to the receiver 28 through the inlet check valve 29a and the receiver inlet opening/closing valve 28c. The high-pressure vapor refrigerant sent to the precooling heat exchanger 35 is also radiated in the precooling heat exchanger 35 by heat exchange with outdoor air supplied as a heat source by the outdoor fan 34. The refrigerant radiated in the precooling heat exchanger 35 is then sent to the refrigerant cooler 36, and cools the electrical equipment item 20a. After the refrigerant passed through the refrigerant cooler 36, and the flow rate is adjusted in the refrigerant-cooling-side flow rate adjusting valve 37, the refrigerant is sent to the receiver outlet pipe 28b. After the refrigerant passed through the refrigerant cooler 36, and the flow rate is adjusted in the refrigerant-cooling-side flow rate adjusting valve 37, the refrigerant is sent to the receiver outlet pipe 28b. The refrigerant sent to the receiver 28 from the first heat-source-side heat exchanger 24 is temporarily collected in the receiver 28, then merged in the receiver outlet pipe 28b with the refrigerant passed through the refrigerant cooler 36, and the refrigerant is sent to the liquid refrigerant communicating pipe 7 through the outlet check valve 29c and the liquid-side shutoff valve 31.

The refrigerant sent to the liquid refrigerant communicating pipe 7 is sent only to the liquid connecting pipe 61a of the connecting unit 4a. The refrigerant sent to the liquid connecting pipe 61a of the connecting unit 4a is then sent to the usage-side flow rate adjusting valve 51a of the usage unit 3a.

After the refrigerant is sent to the usage-side flow rate adjusting valve 51a, and the flow rate is adjusted in the usage-side flow rate adjusting valve 51a, the refrigerant is evaporated in the usage-side heat exchanger 52a by heat exchange with indoor air supplied by the indoor fan 53a, and becomes low-pressure vapor refrigerant. Meanwhile, the indoor air is cooled and supplied indoors, and air-cooling operation by only the usage unit 3a is performed. The low-pressure vapor refrigerant is then sent to the merging vapor connecting pipe 65a of the connecting unit 4a.

The low-pressure vapor refrigerant sent to the merging vapor connecting pipe 65a is then sent to the high/low-pressure vapor refrigerant communicating pipe 8 through the high-pressure vapor opening/closing valve 66a and the high-pressure vapor connecting pipe 63a, and also sent to the low-pressure vapor refrigerant communicating pipe 9 through the low-pressure vapor opening/closing valve 67a and the low-pressure vapor connecting pipe 64a.

The low-pressure vapor refrigerant sent to the vapor refrigerant communicating pipes 8, 9 is then returned to the intake side of the compressor 21 through the vapor-side shutoff valves 32, 33 and the high/low pressure switching mechanism 30.

Operation in the air-cooling operation mode (small evaporation load) is performed in the manner described above. In the air-cooling operation mode (small evaporation load), it is possible for refrigerant to always be circulated to the refrigerant cooler 36 through the precooling heat exchanger 35, as described above. It is thereby possible to maintain the flow rate of refrigerant flowing through the refrigerant cooler 36 and cool the electrical equipment item 20a in the air-cooling operation mode (small evaporation load).

<Air-Heating Operation Mode (Large Radiation Load)>

Figure 6:
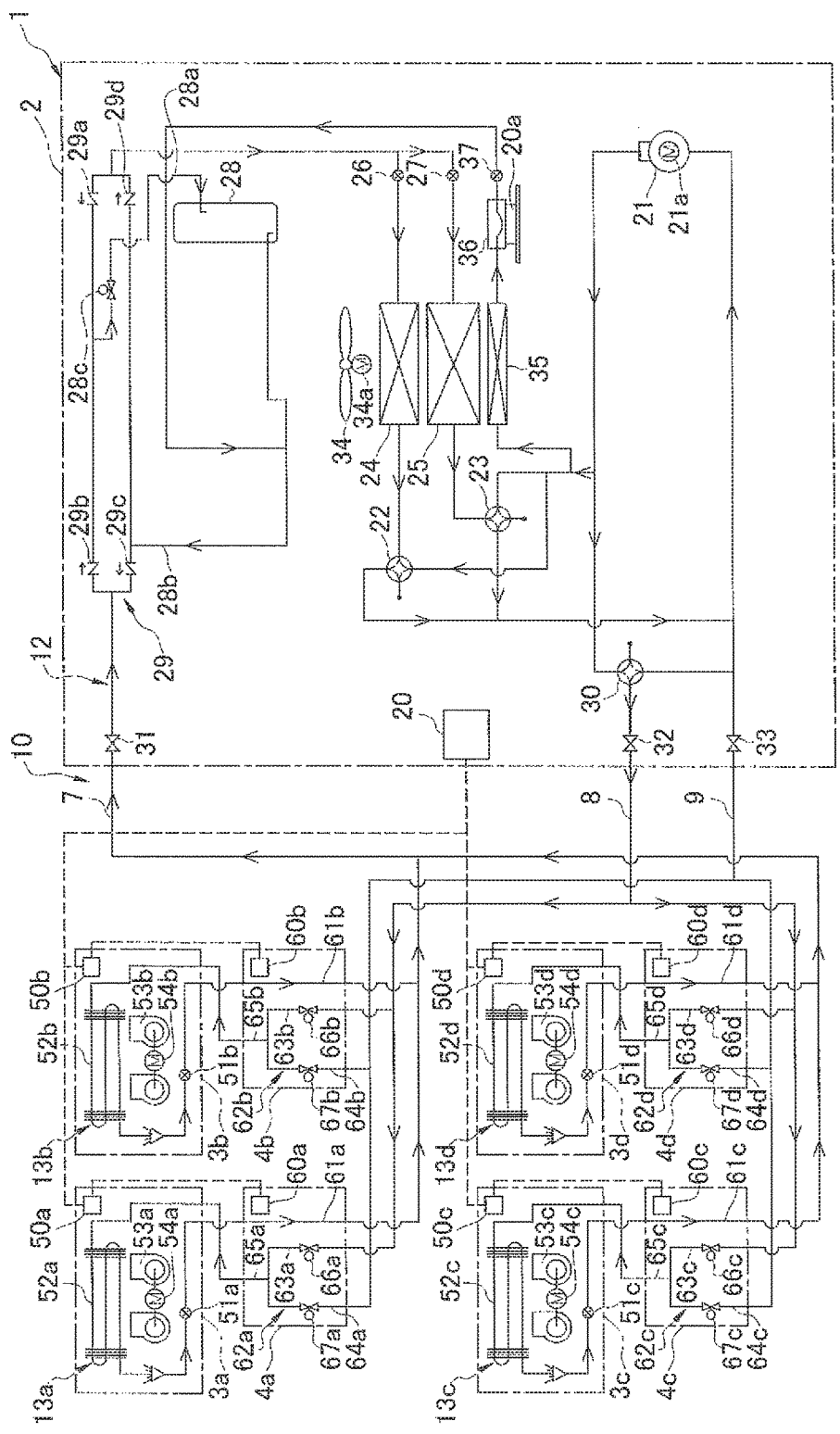
FIG. 6 is a view illustrating operation (refrigerant flow) in an air-heating operation mode (large radiation load) of the simultaneous-cooling/heating-operation-type air conditioning apparatus.

In the air-heating operation mode (large radiation load), e.g., when all of the usage units 3a, 3b, 3c, 3d are performing air-heating operation (i.e., operation in which all of the usage-side heat exchangers 52a, 52b, 52c, 52d function as refrigerant radiators) and both of the heat-source-side heat exchangers 24, 25 as main heat-source-side heat exchangers function as refrigerant evaporators, the refrigerant circuit 10 of the air conditioning apparatus 1 is configured as illustrated in FIG. 6 (the flow of refrigerant being illustrated by arrows drawn in the refrigerant circuit 10 in FIG. 6).

Specifically, in the heat-source unit 2, the first heat exchange switching mechanism 22 is switched to an evaporating operation state (indicated by broken lines in the first heat exchange switching mechanism 22 in FIG. 6) and the second heat exchange switching mechanism 23 is switched to an evaporating operation state (indicated by broken lines in the second heat exchange switching mechanism 23 in FIG. 6), whereby both of the heat-source-side heat exchangers 24, 25 are caused to function as refrigerant evaporators. The high/low pressure switching mechanism 30 is also switched to a mainly-radiation-load operation state (indicated by broken lines in the high/low pressure switching mechanism 30 in FIG. 6). The opening degrees of the heat-source-side flow rate adjusting valves 26, 27 are also adjusted, and the receiver inlet opening/closing valve 28c is open. Furthermore, the opening degree of the refrigerant-cooling-side flow rate adjusting valve 37 is adjusted, and high-pressure vapor refrigerant discharged from the compressor 21 flows to the precooling heat exchanger 35. In the connecting units 4a, 4b, 4c, 4d, the high-pressure vapor opening/closing valves 66a, 66b, 66c, 66d are placed in the open state and the low-pressure vapor opening/closing valves 67a, 67b, 67c, 67d are placed in the closed state, whereby all of the usage-side heat exchangers 52a, 52b, 52c, 52d of the usage units 3a, 3b, 3c, 3d are caused to function as refrigerant radiators, and all of the usage-side heat exchangers 52a, 52b, 52c, 52d of the usage units 3a, 3b, 3c, 3d and the discharge side of the compressor 21 of the heat-source unit 2 are connected via the high/low-pressure vapor refrigerant communicating pipe 8. In the usage units 3a, 3b, 3c, 3d, the opening degrees of the usage-side flow rate adjusting valves 51a, 51b, 51c, 51d are adjusted.

In the refrigerant circuit 10 thus configured, high-pressure vapor refrigerant compressed and discharged by the compressor 21 is sent to the high/low-pressure vapor refrigerant communicating pipe 8 through the high/low pressure switching mechanism 30 and the high/low-pressure-vapor-side shutoff valve 32. The high-pressure vapor refrigerant compressed and discharged by the compressor 21 is also sent to the precooling heat exchanger 35. The high-pressure vapor refrigerant sent to the precooling heat exchanger 35 is then radiated in the precooling heat exchanger 35 by heat exchange with outdoor air supplied as a heat source by the outdoor fan 34. The refrigerant radiated in the precooling heat exchanger 35 is then sent to the refrigerant cooler 36, and cools the electrical equipment item 20a. After the refrigerant passed through the refrigerant cooler 36, and the flow rate is adjusted in the refrigerant-cooling-side flow rate adjusting valve 37, the refrigerant is sent to the receiver outlet pipe 28b.

The refrigerant sent to the high/low-pressure vapor refrigerant communicating pipe 8 is branched into four streams and sent to the high-pressure vapor connecting pipes 63a, 63b, 63c, 63d of the connecting units 4a, 4b, 4c, 4d. The high-pressure vapor refrigerant sent to the high-pressure vapor connecting pipes 63a, 63b, 63c, 63d is then sent to the usage-side heat exchangers 52a, 52b, 52c, 52d of the usage units 3a, 3b, 3c, 3d through the high-pressure vapor opening/closing, valves 66a, 66b, 66c, 66d and the merging vapor connecting pipes 65a, 65b, 65c, 65d.

The high-pressure vapor refrigerant sent to the usage-side heat exchangers 52a, 52b, 52c, 52d is then radiated in the usage-side heat exchangers 52a, 52b, 52c, 52d by heat exchange with indoor air supplied by the indoor fans 53a, 53b, 53c, 53d. Meanwhile, the indoor air is heated and supplied indoors, and air-heating operation by the usage units 3a, 3b, 3c, 3d is performed. After the refrigerant is radiated in the usage-side heat exchangers 52a, 52b, 52c, 52d, and the flow rate is adjusted in the usage-side flow rate adjusting valves 51a, 51b, 51c, 51d, the refrigerant is sent to the liquid connecting pipes 61a, 61b, 61c, 61d of the connecting units 4a, 4b, 4c, 4d.

The refrigerant sent to the liquid connecting pipes 61a, 61b, 61c, 61d is then sent to the liquid refrigerant communicating pipe 7 and merged.

The refrigerant sent to the liquid refrigerant communicating pipe 7 is then sent to the receiver 28 through the liquid-side shutoff valve 31, the inlet check valve 29b, and the receiver inlet opening/closing valve 28c. The refrigerant sent to the receiver 28 is temporarily collected in the receiver 28, then merged in the receiver outlet pipe 28b with the refrigerant passed through the refrigerant cooler 36, and the refrigerant is sent to both of the heat-source-side flow rate adjusting valves 26, 27 through the outlet check valve 29d. After the refrigerant is sent to the heat-source-side flow rate adjusting valves 26, 27, and the flow rate is adjusted in the heat-source-side flow rate adjusting valves 26, 27, the refrigerant is evaporated in the heat-source-side heat exchangers 24, 25 by heat exchange with outdoor air supplied by the outdoor fan 34, and becomes low-pressure vapor refrigerant, and is sent to the heat exchange switching mechanisms 22, 23. The low-pressure vapor refrigerant sent to the heat exchange switching mechanisms 22, 23 is merged and returned to the intake side of the compressor 21.

Operation in the air-heating operation mode (large radiation load) is performed in the manner described above. In the air-heating operation mode (large radiation load), it is possible for refrigerant to always be circulated to the refrigerant cooler 36 through the precooling heat exchanger 35, as described above. It is thereby possible to maintain the flow rate of refrigerant flowing through the refrigerant cooler 36 and cool the electrical equipment item 20a in the air-heating operation mode (large radiation load).

<Air-Heating Operation Mode (Small Radiation Load)>

Figure 7:
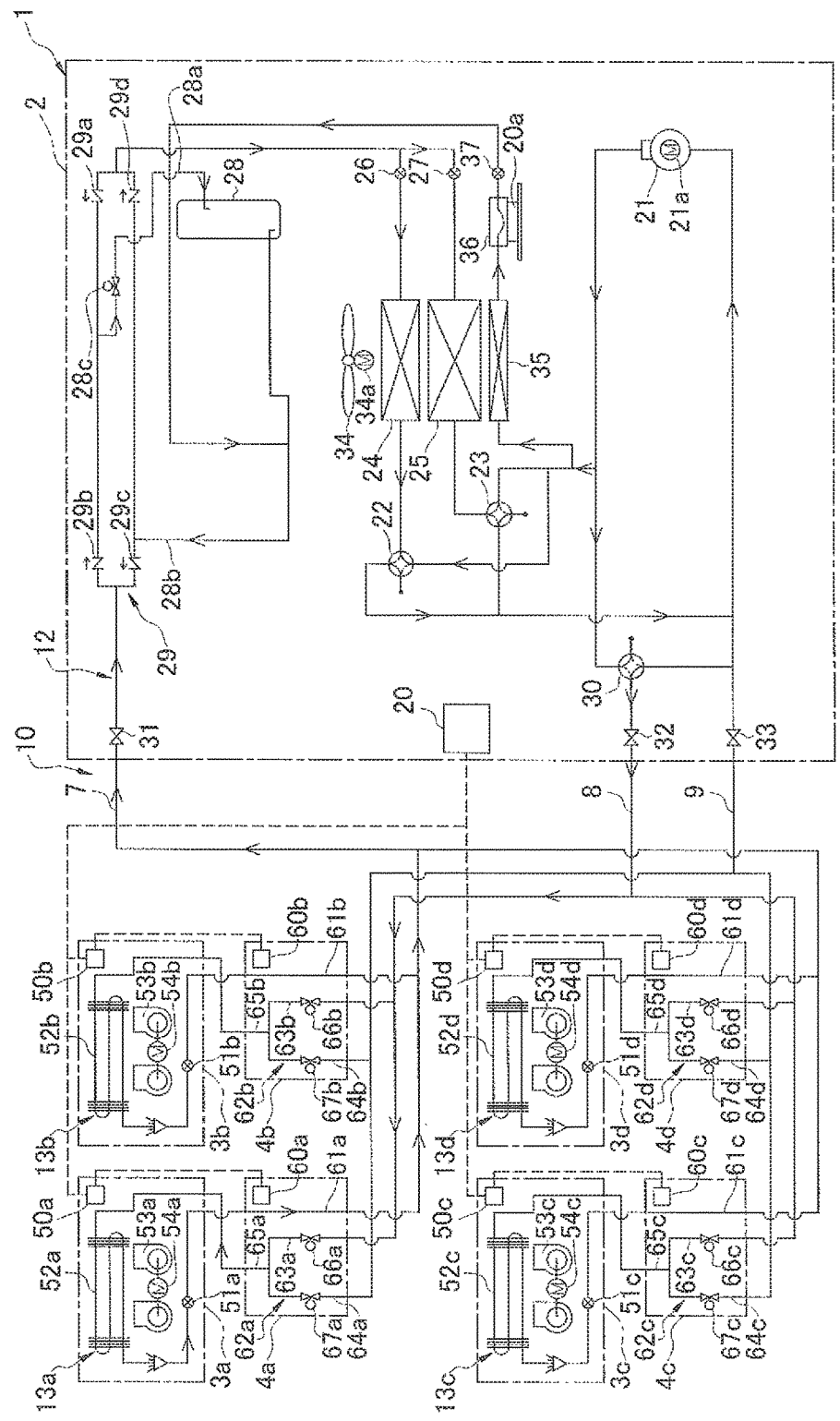
FIG. 7 is a view illustrating operation (refrigerant flow) in an air-heating operation mode (small radiation load) of the simultaneous-cooling/heating-operation-type air conditioning apparatus.

In the air-heating operation mode (small radiation load), e.g., when only the usage unit 3a is performing air-heating operation (i.e., operation in which only the usage-side heat exchanger 52a functions as a refrigerant radiator) and only the first heat-source-side heat exchanger 24 as a main heat-source-side heat exchanger functions as a refrigerant evaporator, the refrigerant circuit 10 of the air conditioning apparatus 1 is configured as illustrated in FIG. 7 (the flow of refrigerant being illustrated by arrows drawn in the refrigerant circuit 10 in FIG. 7).

Specifically, in the heat-source unit 2, the first heat exchange switching mechanism 22 is switched to the evaporating operation state (indicated by broken lines in the first heat exchange switching mechanism 22 in FIG. 7), whereby only the first heat-source-side heat exchanger 24 is caused to function as a refrigerant evaporator. The high/low pressure switching mechanism 30 is also switched to a mainly-radiation-load operation state (indicated by broken lines in the high/low pressure switching mechanism 30 in FIG. 7). The opening degree of the first heat-source-side flow rate adjusting valve 26 is also adjusted, the second heat-source-side flow rate adjusting valve 27 is closed, and the receiver inlet opening/closing valve 28c is open. Furthermore, the opening degree of the refrigerant-cooling-side flow rate adjusting valve 37 is adjusted, and high-pressure vapor refrigerant discharged from the compressor 21 flows to the precooling heat exchanger 35. In the connecting units 4a, 4b, 4c, 4d, the high-pressure vapor opening/closing valve 66a is placed in the open state and the high-pressure vapor opening/closing valves 66b, 66c, 66d and the low-pressure vapor opening/closing valves 67a, 67b, 67c, 67d are placed in the closed state, whereby only the usage-side heat exchanger 52a of the usage unit 3a is caused to function as a refrigerant radiator, and the usage-side heat exchanger 52a of the usage unit 3a and the discharge side of the compressor 21 of the heat-source unit 2 are connected via the high/low-pressure vapor refrigerant communicating pipe 8. The opening degree of the usage-side flow rate adjusting valve 51a in the usage unit 3a is adjusted, and the usage-side flow rate adjusting valves 51b, 51c, 51d in the usage units 3b, 3c, 3d are closed.

In the refrigerant circuit 10 thus configured, high-pressure vapor refrigerant compressed and discharged by the compressor 21 is sent to the high/low-pressure vapor refrigerant communicating pipe 8 through the high/low pressure switching mechanism 30 and the high/low-pressure-vapor-side shutoff valve 32. The high-pressure vapor refrigerant compressed and discharged by the compressor 21 is also sent to the precooling heat exchanger 35. The high-pressure vapor refrigerant sent to the precooling heat exchanger 35 is then radiated in the precooling heat exchanger 35 by heat exchange with outdoor air supplied as a heat source by the outdoor fan 34. The refrigerant radiated in the precooling heat exchanger 35 is then sent to the refrigerant cooler 36, and cools the electrical equipment item 20a. After the refrigerant passed through the refrigerant cooler 36, and the flow rate is adjusted in the refrigerant-cooling-side flow rate adjusting valve 37, the refrigerant is sent to the receiver outlet pipe 28b.

The high-pressure vapor refrigerant sent to the high/low-pressure vapor refrigerant communicating pipe 8 is sent only to the high-pressure vapor connecting pipe 63a of the connecting unit 4a. The high-pressure vapor refrigerant sent to the high-pressure vapor connecting pipe 63a is then sent to the usage-side heat exchanger 52a of the usage unit 3a through the high-pressure vapor opening/closing valve 66a and the merging vapor connecting pipe 65a.

The high-pressure vapor refrigerant sent to the usage-side heat exchanger 52a is then radiated in the usage-side heat exchanger 52a by heat exchange with indoor air supplied by the indoor fan 53a. Meanwhile, the indoor air is heated and supplied indoors, and air-heating operation by only the usage unit 3a is performed. After the refrigerant is radiated in the usage-side heat exchanger 52a, and the flow rate is adjusted in the usage-side flow rate adjusting valve 51a, the refrigerant is sent to the liquid connecting pipe 61a of the connecting unit 4a.

The refrigerant sent to the liquid connecting pipe 61a is then sent to the liquid refrigerant communicating pipe 7.

The refrigerant sent to the liquid refrigerant communicating pipe 7 is then sent to the receiver 28 through the liquid-side shutoff valve 31, the inlet check valve 29b, and the receiver inlet opening/closing valve 28c. The refrigerant sent to the receiver 28 is temporarily collected in the receiver 28, then merged in the receiver outlet pipe 28b with the refrigerant passed through the refrigerant cooler 36, and the refrigerant is sent to only the first heat-source-side flow rate adjusting valve 26 through the outlet check valve 29d. After the refrigerant is sent to the first heat-source-side flow rate adjusting valve 26, the flow rate is adjusted in the first heat-source-side flow rate adjusting valve 26, the refrigerant is evaporated in the first heat-source-side heat exchanger 24 by heat exchange with outdoor air supplied by the outdoor fan 34, and becomes low-pressure vapor refrigerant, and is sent to the first heat exchange switching mechanism 22. The low-pressure vapor refrigerant sent to the first heat exchange switching mechanism 22 is then returned to the intake side of the compressor 21.

Operation in the air-heating operation mode (small radiation load) is performed in the manner described above. In the air-heating operation mode (small radiation load), it is possible for refrigerant to always be circulated to the refrigerant cooler 36 through the precooling, heat exchanger 35, as described above. It is thereby possible to maintain the flow rate of refrigerant flowing through the refrigerant cooler 36 and cool the electrical equipment item 20a in the air-heating operation mode (small radiation load).

<Simultaneous Cooling/Heating Operation Mode (Mainly Evaporation Load)>

Figure 8:
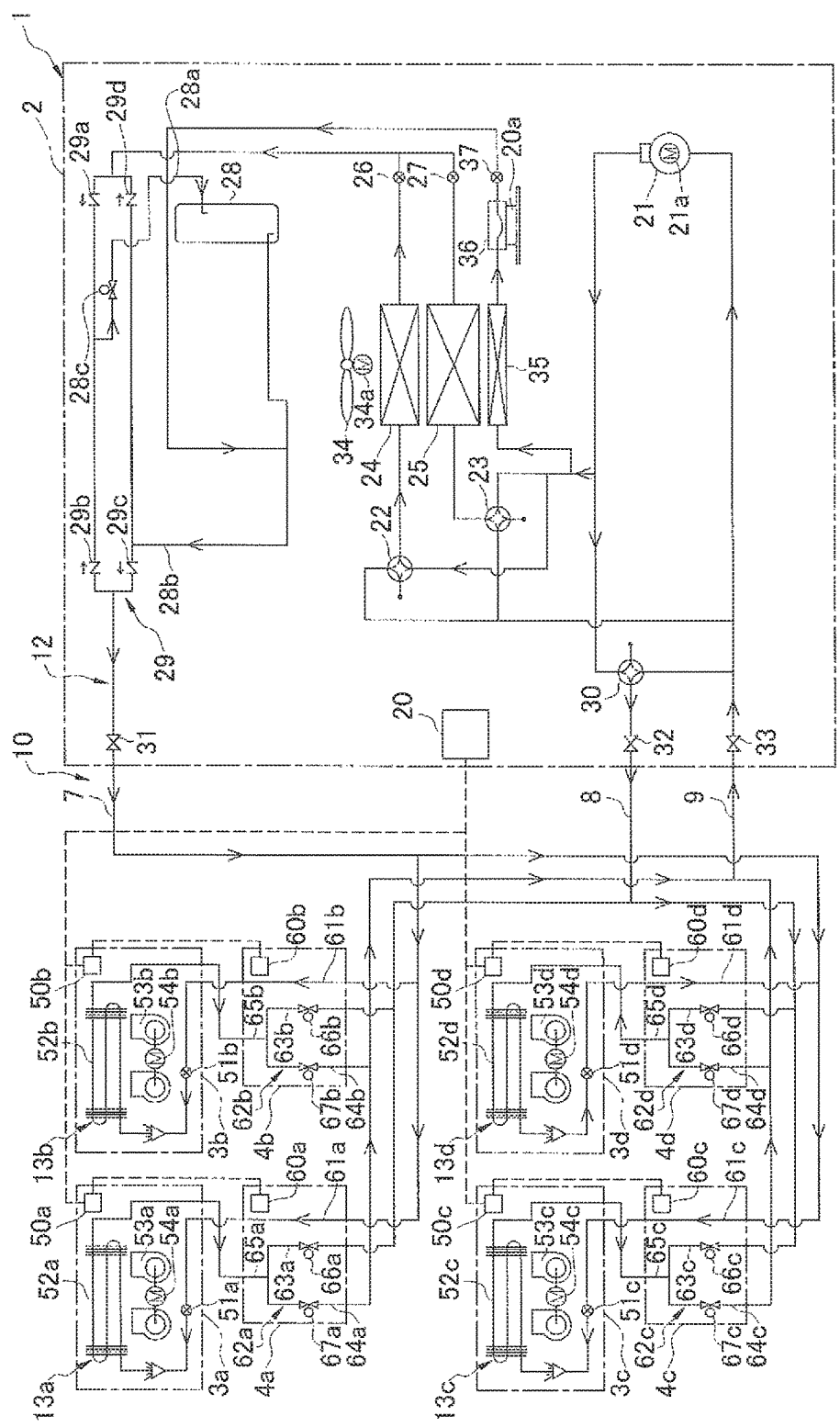
FIG. 8 is a view illustrating operation (refrigerant flow) in a simultaneous cooling/heating operation mode (mainly evaporation load) of the simultaneous-cooling/heating-operation-type air conditioning apparatus.

In the simultaneous cooling/heating operation mode (mainly evaporation load), e.g., when the usage units 3a, 3b, 3c are performing air-cooling operation and the usage unit 3d is performing air-heating operation (i.e., operation in which the usage-side heat exchangers 52a, 52b, 52c function as refrigerant evaporators and the usage-side heat exchanger 52d functions as a refrigerant radiator) and only the first heat-source-side heat exchanger 24 as a main heat-source-side heat exchanger functions as a refrigerant radiator, the refrigerant circuit 10 of the air conditioning apparatus 1 is configured as illustrated in FIG. 8 (the flow of refrigerant being illustrated by arrows drawn in the refrigerant circuit 10 in FIG. 8).

Specifically, in the heat-source unit 2, the first heat exchange switching mechanism 22 is switched to the radiating operation state (indicated by solid lines in the first heat exchange switching mechanism 22 in FIG. 8), whereby only the first heat-source-side heat exchanger 24 is caused to function as a refrigerant radiator. The high/low pressure switching mechanism 30 is also switched to a mainly-radiation-load operation state (indicated by broken lines in the high/low pressure switching mechanism 30 in FIG. 8). The opening degree of the first heat-source-side flow rate adjusting valve 26 is also adjusted, the second heat-source-side flow rate adjusting valve 27 is closed, and the receiver inlet opening/closing valve 28c is open. Furthermore, the opening degree of the refrigerant-cooling-side flow rate adjusting valve 37 is adjusted, and high-pressure vapor refrigerant discharged from the compressor 21 flows to the precooling heat exchanger 35. In the connecting units 4a, 4b, 4c, 4d, the high-pressure vapor opening/closing valve 66d and the low-pressure vapor opening/closing valves 67a, 67b, 67c are placed in the open state and the high-pressure vapor opening/closing valves 66a, 66b, 66c and the low-pressure vapor opening/closing valve 67d are placed in the closed state, whereby the usage-side heat exchangers 52a, 52b, 52c of the usage units 3a, 3b, 3c are caused to function as refrigerant evaporators, the usage-side heat exchanger 52d of the usage unit 3d is caused to function as a refrigerant radiator, the usage-side heat exchangers 52a, 52b, 52c of the usage units 3a, 3b, 3c and the intake side of the compressor 21 of the heat-source unit 2 are connected via the low-pressure vapor refrigerant communicating pipe 9, and the usage-side heat exchanger 52d of the usage unit 3d and the discharge side of the compressor 21 of the heat-source unit 2 are connected via the high/low-pressure vapor refrigerant communicating pipe 8. In the usage units 3a. 3b, 3c, 3d, the opening degrees of the usage-side flow rate adjusting valves 51a, 51b, 51c, 51d are adjusted.

In the refrigerant circuit 10 thus configured, a portion of the high-pressure vapor refrigerant compressed and discharged by the compressor 21 is sent to the high/low-pressure vapor refrigerant communicating pipe 8 through the high/low pressure switching mechanism 30 and the high/low-pressure-vapor-side shutoff valve 32, and the remainder thereof is sent to the first heat-source-side heat exchanger 24 through the first heat exchange switching mechanism 22. The high-pressure vapor refrigerant compressed and discharged by the compressor 21 is also sent to the precooling heat exchanger 35.

The high-pressure vapor refrigerant sent to the high/low-pressure vapor refrigerant communicating pipe 8 is sent to the high-pressure vapor connecting pipe 63d of the connecting unit 4d. The high-pressure vapor refrigerant sent to the high-pressure vapor connecting pipe 63d is sent to the usage-side heat exchanger 52d of the usage unit 3d through the high-pressure vapor opening/closing valve 66d and the merging vapor connecting pipe 65d.

The high-pressure vapor refrigerant sent to the usage-side heat exchanger 52d is then radiated in the usage-side heat exchanger 52d by heat exchange with indoor air supplied by the indoor fan 53d. Meanwhile, the indoor air is heated and supplied indoors, and air-heating operation by the usage unit 3d is performed. After the refrigerant is radiated in the usage-side heat exchanger 52d, and the flow rate is adjusted in the usage-side flow rate adjusting valve 51d, the refrigerant is sent to the liquid connecting pipe 61d of the connecting unit 4d.

The high-pressure vapor refrigerant sent to the first heat-source-side heat exchanger 24 is also radiated in the first heat-source-side heat exchanger 24 by heat exchange with outdoor air supplied as a heat source by the outdoor fan 34. After the refrigerant is radiated in the first heat-source-side heat exchanger 24, and the flow rate is adjusted in the first heat-source-side flow rate adjusting valve 26, the refrigerant is sent to the receiver 28 through the inlet check valve 29a and the receiver inlet opening/closing valve 28c. The high-pressure vapor refrigerant sent to the precooling heat exchanger 35 is also radiated in the precooling heat exchanger 35 by heat exchange with outdoor air supplied as a heat source by the outdoor fan 34. The refrigerant radiated in the precooling heat exchanger 35 is then sent to the refrigerant cooler 36, and cools the electrical equipment item 20a. After the refrigerant passed through the refrigerant cooler 36, and the flow rate is adjusted in the refrigerant-cooling-side flow rate adjusting valve 37, the refrigerant is sent to the receiver outlet pipe 28b. The refrigerant sent to the receiver 28 from the first heat-source-side heat exchanger 24 is temporarily collected in the receiver 28, then merged in the receiver outlet pipe 28b with the refrigerant passed through the refrigerant cooler 36, and the refrigerant is sent to the liquid refrigerant communicating pipe 7 through the outlet check valve 29c and the liquid-side shutoff valve 31.

The refrigerant radiated in the usage-side heat exchanger 52d and sent to the liquid connecting pipe 61d is then sent to the liquid refrigerant communicating pipe 7, radiated in the first heat-source-side heat exchanger 24, and merged with the refrigerant sent to the liquid refrigerant communicating pipe 7.

The refrigerant merged in the liquid refrigerant communicating pipe 7 is then branched into three streams and sent to the liquid connecting pipes 61a, 61b, 61c of the connecting units 4a, 4b, 4c. The refrigerant sent to the liquid connecting pipes 61a, 61b, 61c is then sent to the usage-side flow rate adjusting valves 51a, 51b, 51c of the usage units 3a, 3b, 3c.

After the refrigerant is sent to the usage-side flow rate adjusting valves 51a, 51b, 51c, and the flow rate is adjusted in the usage-side flow rate adjusting valves 51a, 51b the refrigerant is evaporated in the usage-side heat exchangers 52a, 52b, 52c by heat exchange with indoor air supplied by the indoor fans 53a, 53b, 53c, and becomes low-pressure vapor refrigerant. Meanwhile, the indoor air is cooled and supplied indoors, and air-cooling operation by the usage units 3a, 3b, 3c is performed. The low-pressure vapor refrigerant is then sent to the merging vapor connecting pipes 65a, 65b, 65c of the connecting units 4a, 4b, 4c.

The low-pressure vapor refrigerant sent to the merging vapor connecting pipes 65a, 65b, 65c is then sent to the low-pressure vapor refrigerant communicating pipe 9 through the low-pressure vapor opening/closing valves 67a, 67b, 67c and the low-pressure vapor connecting pipes 64a, 64b, 64c and merged.

The low-pressure vapor refrigerant sent to the low-pressure vapor refrigerant communicating pipe 9 is then returned to the intake side of the compressor 21 through the vapor-side shutoff valve 33.

Operation in the simultaneous cooling/heating operation mode (mainly evaporation load) is performed in the manner described above. In the simultaneous cooling/heating operation mode (mainly evaporation load), refrigerant is sent from the usage-side heat exchanger 52d functioning as a refrigerant radiator to the usage-side heat exchangers 52a, 52b, 52c functioning as refrigerant evaporators, as described above, whereby heat is recovered between the usage-side heat exchangers 52a, 52b, 52c, 52d. In the simultaneous cooling/heating operation mode (mainly evaporation load), it is possible for refrigerant to always be circulated to the refrigerant cooler 36 through the precooling heat exchanger 35, as described above. It is thereby possible to maintain the flow rate of refrigerant flowing through the refrigerant cooler 36 and cool the electrical equipment item 20a in the simultaneous cooling/heating operation mode (mainly evaporation load).

<Simultaneous Cooling/Heating Operation Mode (Mainly Radiation Load)>

Figure 9:
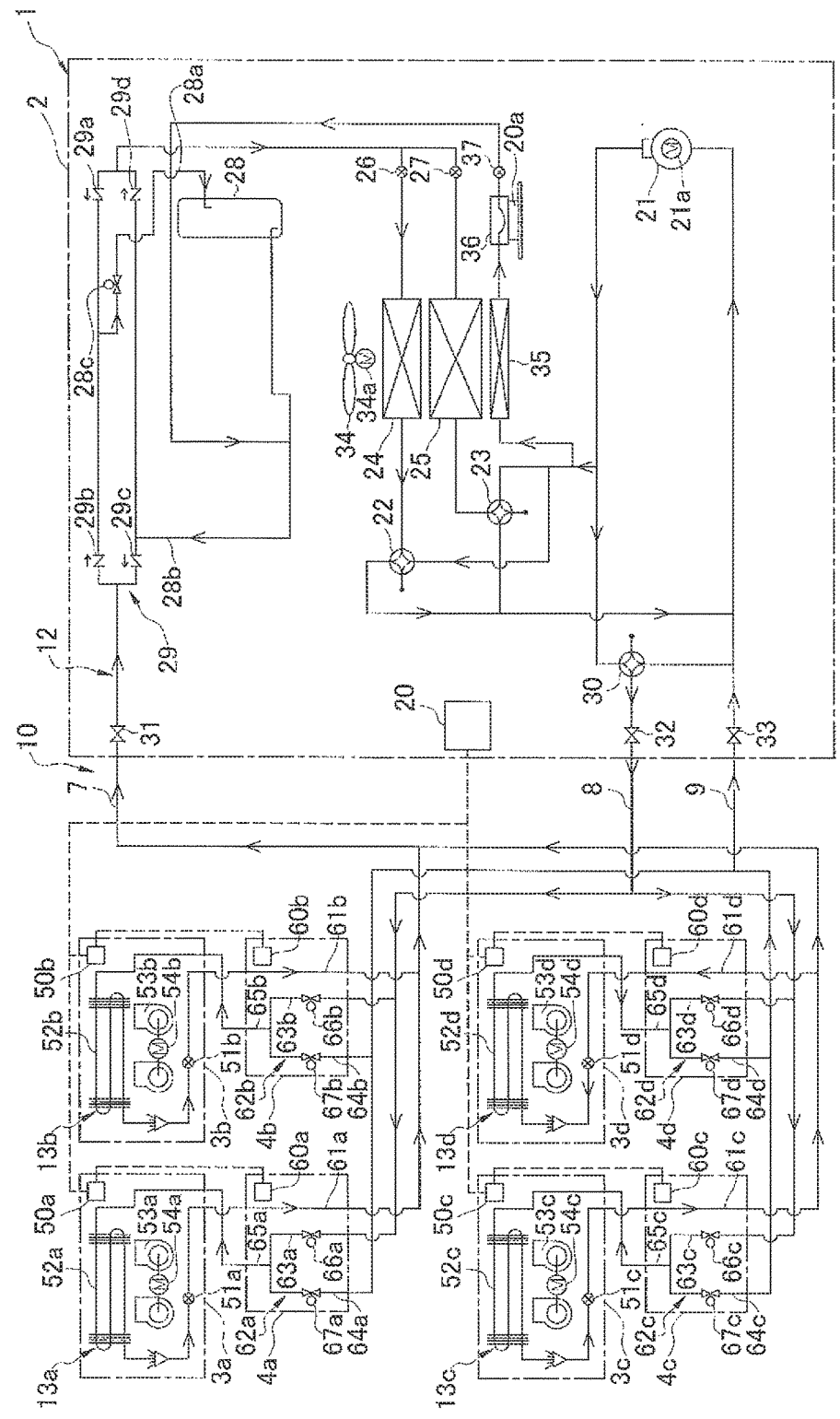
FIG. 9 is a view illustrating operation (refrigerant flow) in a simultaneous cooling/heating operation mode (mainly radiation load) of the simultaneous-cooling/heating-operation-type air conditioning apparatus.

In the simultaneous cooling/heating operation mode (mainly radiation load), e.g., when the usage units 3a, 3b, 3c are performing air-heating operation and the usage unit 3d is performing air-cooling operation (i.e., operation in which the usage-side heat exchangers 52a, 5b, 52c function as refrigerant radiators and the usage-side heat exchanger 52d functions as a refrigerant evaporator) and only the first heat-source-side heat exchanger 24 as a main heat-source-side heat exchanger functions as a refrigerant evaporator, the refrigerant circuit 10 of the air conditioning apparatus 1 is configured as illustrated in FIG. 9 (the flow of refrigerant being illustrated by arrows drawn in the refrigerant circuit 10 in FIG. 9).

Specifically, in the heat-source unit 2, the first heat exchange switching mechanism 22 is switched to the evaporating operation state (indicated by broken lines in the first heat exchange switching mechanism 22 in FIG. 9), whereby only the first heat-source-side heat exchanger 24 is caused to function as a refrigerant evaporator. The high/low pressure switching mechanism 30 is also switched to a mainly-radiation-load operation state (indicated by broken lines in the high/low pressure switching mechanism 30 in FIG. 9). The opening degree of the first heat-source-side flow rate adjusting valve 26 is also adjusted, the second heat-source-side flow rate adjusting valve 27 is closed, and the receiver inlet opening/closing valve 28c is open. Furthermore, the opening degree of the refrigerant-cooling-side flow rate adjusting valve 37 is adjusted, and high-pressure vapor refrigerant discharged from the compressor 21 flows to the precooling heat exchanger 35. In the connecting units 4a, 4b, 4c, 4d, the high-pressure vapor opening/closing valves 66a, 66b, 66c and the low-pressure vapor opening/closing valve 67d are placed in the open state and the high-pressure vapor opening/closing valve 66d and the low-pressure vapor opening/closing valve 67a, 67b, 67c are placed in the closed state, whereby the usage-side heat exchangers 52a, 52b, 52c of the usage units 3a, 3b, 3c are caused to function as refrigerant radiators, the usage-side heat exchanger 52d of the usage unit 3d is caused to function as a refrigerant evaporator, the usage-side heat exchanger 52d of the usage unit 3d and the intake side of the compressor 21 of the heat-source unit 2 are connected via the low-pressure vapor refrigerant communicating pipe 9, and the usage-side heat exchangers 52a, 52b, 52c of the usage units 3a, 3b, 3c and the discharge side of the compressor 21 of the heat-source unit 2 are connected via the high/low-pressure vapor refrigerant communicating pipe 8. In the usage units 3a, 3b, 3c, 3d, the opening degrees of the usage-side flow rate adjusting valves 51a, 51b, 51c, 51d are adjusted.

In the refrigerant circuit 10 thus configured, high-pressure vapor refrigerant compressed and discharged by the compressor 21 is sent to the high/low-pressure vapor refrigerant communicating pipe 8 through the high/low pressure switching mechanism 30 and the high/low-pressure-vapor-side shutoff valve 32. The high-pressure vapor refrigerant compressed and discharged by the compressor 21 is also sent to the precooling heat exchanger 35. The high-pressure vapor refrigerant sent to the precooling heat exchanger 35 is then radiated in the precooling heat exchanger 35 by heat exchange with outdoor air supplied as a heat source by the outdoor fan 34. The refrigerant radiated in the precooling heat exchanger 35 is then sent to the refrigerant cooler 36, and cools the electrical equipment item 20a. After the refrigerant passed through the refrigerant cooler 36, and the flow rate is adjusted in the refrigerant-cooling-side flow rate adjusting valve 37, the refrigerant is sent to the receiver outlet pipe 28b.

The high-pressure vapor refrigerant sent to the high/low-pressure vapor refrigerant communicating pipe 8 is then branched into three streams and sent to the high-pressure vapor connecting pipes 63a, 63b, 63c of the connecting units 4a, 4b, 4c. The high-pressure vapor refrigerant sent to the high-pressure vapor connecting pipes 63a, 63b, 63c is sent to the usage-side heat exchangers 52a, 52b, 52c of the usage units 3a, 3b, 3c through the high-pressure vapor opening/closing valves 66a, 66b, 66c and the merging vapor connecting pipes 65a, 65b, 65c.

The high-pressure vapor refrigerant sent to the usage-side heat exchangers 52a, 52b, 52c is then radiated in the usage-side heat exchangers 52a, 52b, 52c by heat exchange with indoor air supplied by the indoor fans 53a, 53b, 53c. Meanwhile, the indoor air is heated and supplied indoors, and air-heating operation by the usage units 3a, 3b, 3c is performed. After the refrigerant is radiated in the usage-side heat exchangers 52a, 52b, 52c, and the flow rate is adjusted in the usage-side flow rate adjusting valves 51a, 51b, 51c, the refrigerant is sent to the liquid connecting pipes 61a, 61b, 61c of the connecting units 4a, 4b, 4c.

The refrigerant sent to the liquid connecting pipes 61a, 61b, 61c, 61d is then sent to the liquid refrigerant communicating pipe 7 and merged.

A portion of the refrigerant merged in the liquid refrigerant communicating pipe 7 is sent to the liquid connecting pipe 0ld of the connecting unit 4d, and the remainder thereof is sent to the receiver 28 through the liquid-side shutoff valve 31, the inlet check valve 29b, and the receiver inlet opening/closing valve 28c.

The refrigerant sent to the liquid connecting pipe 61d of the connecting unit 4d is then sent to the usage-side flow rate adjusting valve 51d of the usage unit 3d.

After the refrigerant is sent to the usage-side flow rate adjusting valve 51d, and the flow rate is adjusted in the usage-side flow rate adjusting valve 51d, the refrigerant is evaporated in the usage-side heat exchanger 52d by heat exchange with indoor air supplied by the indoor fan 53d, and becomes low-pressure vapor refrigerant. Meanwhile, the indoor air is cooled and supplied indoors, and air-cooling operation by the usage unit 3d is performed. The low-pressure vapor refrigerant is then sent to the merging vapor connecting pipe 65d of the connecting unit 4d.

The low-pressure vapor refrigerant sent to the merging vapor connecting pipe 65d is then sent to the low-pressure vapor refrigerant communicating pipe 9 through the low-pressure vapor opening/closing valve 67d and the low-pressure vapor connecting pipe 64d.

The low-pressure vapor refrigerant sent to the low-pressure vapor refrigerant communicating pipe 9 is then returned to the intake side of the compressor 21 through the vapor-side shutoff valve 33.

The refrigerant sent to the receiver 28 is temporarily collected in the receiver 28, then merged in the receiver outlet pipe 28b with the refrigerant passed through the refrigerant cooler 36, and the refrigerant is sent to the first heat-source-side flow rate adjusting valve 26 through the outlet check valve 29d. After the refrigerant is sent to the first heat-source-side flow rate adjusting valve 26, and the flow rate is adjusted in the first heat-source-side flow rate adjusting valve 26, the refrigerant is evaporated in the first heat-source-side heat exchanger 24 by heat exchange with outdoor air supplied by the outdoor fan 34, and becomes low-pressure vapor refrigerant, and is sent to the first heat exchange switching mechanism 22. The low-pressure vapor refrigerant sent to the first heat exchange switching mechanism 22 is then merged with the low-pressure vapor refrigerant returned to the intake side of the compressor 21 through the low-pressure vapor refrigerant communicating pipe 9 and the vapor-side shutoff valve 33, and is returned to the intake side of the compressor 21.

Operation in the simultaneous cooling/heating operation mode (mainly radiation load) is performed in the manner described above. In the simultaneous cooling/heating operation mode (mainly radiation load), refrigerant is sent from the usage-side heat exchangers 52a, 52b, 52c functioning as refrigerant radiators to the usage-side heat exchanger 52d functioning as a refrigerant evaporator, as described above, whereby heat is recovered between the usage-side heat exchangers 52a, 52b, 52c, 52d. In the simultaneous cooling/heating operation mode mainly radiation load), it is possible for refrigerant to always be circulated to the refrigerant cooler 36 through the precooling heat exchanger 35, as described above. It is thereby possible to maintain the flow rate of refrigerant flowing through the refrigerant cooler 36 and cool the electrical equipment item 20a in the simultaneous cooling/heating operation mode (mainly radiation load).

<Simultaneous Cooling/Heating Operation Mode (when the Evaporation/Radiation Loads are Balanced and Refrigerant is Circulated to the Heat-Source-Side Heat Exchangers)>

Figure 10:
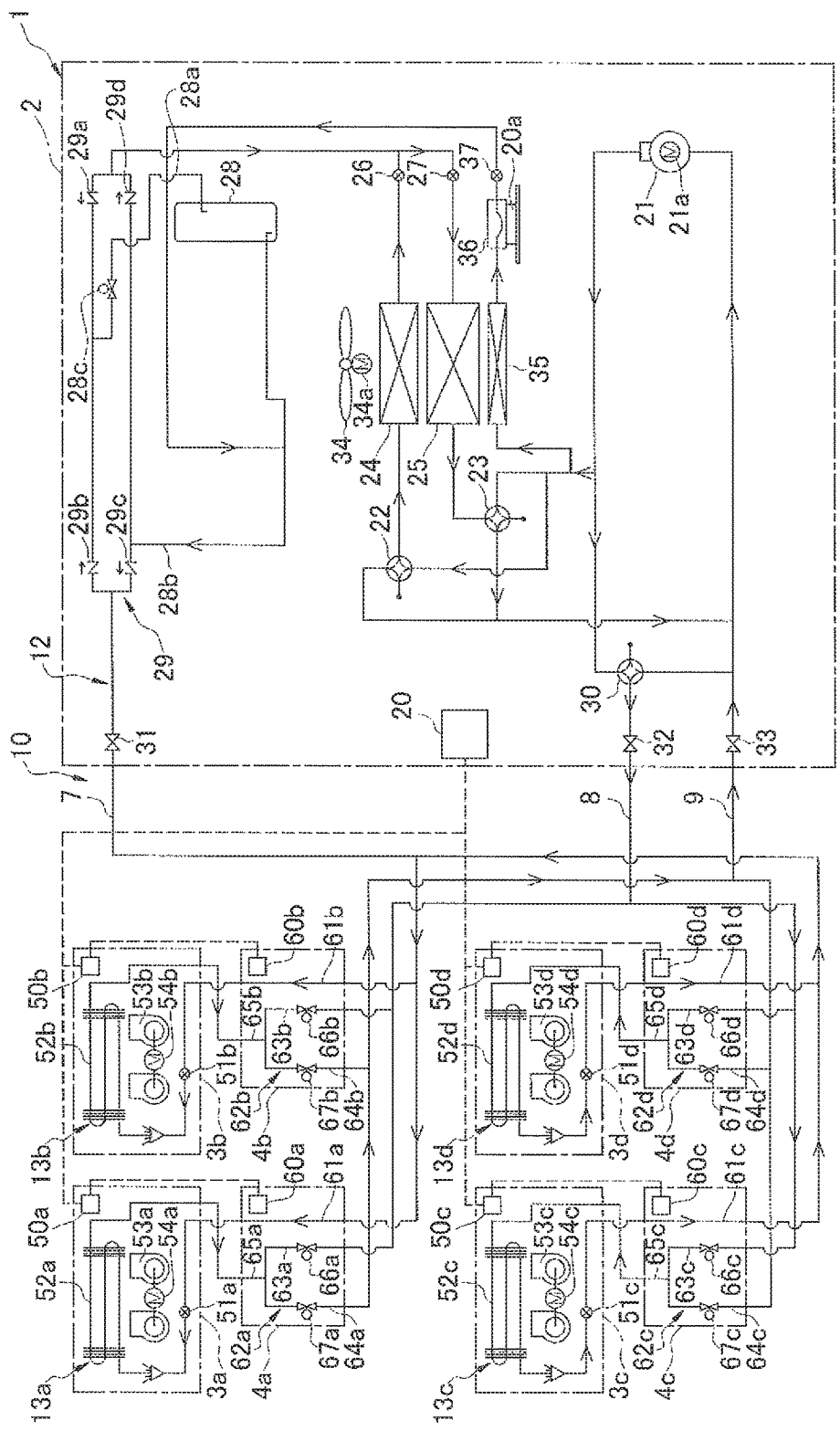
FIG. 10 is a view illustrating operation (refrigerant flow) in a simultaneous cooling/heating operation mode (when the evaporation/radiation loads are balanced and refrigerant is circulated to the heat-source-side heat exchanger) of the simultaneous-cooling/heating-operation-type air conditioning apparatus.

In the simultaneous cooling/heating operation mode (when the evaporation/radiation loads are balanced and refrigerant is circulated to the heat-source-side heat exchangers), e.g., when the usage units 3a, 3b are performing air-cooling operation and the usage units 3c, 3d are performing air-heating operation (i.e., operation in which the usage-side heat exchangers 52a, 52b function as refrigerant evaporators and the usage-side heat exchangers 52c, 52d function as refrigerant radiators), the first heat-source-side heat exchanger 24 as a main heat-source-side heat exchanger functions as a refrigerant radiator, and the second heat-source-side heat exchanger 25 as a main heat-source-side heat exchanger functions as a refrigerant evaporator, the refrigerant circuit 10 of the air conditioning apparatus 1 is configured as illustrated in FIG. 10 (the flow of refrigerant being illustrated by arrows drawn in the refrigerant circuit 10 in FIG. 10).

Specifically, in the heat-source unit 2, the first heat exchange switching mechanism 22 is switched to the radiating operation state (indicated by solid lines in the first heat exchange switching mechanism 22 in FIG. 10) and the second heat exchange switching mechanism 23 is switched to the evaporating operation state (indicated by broken lines in the second heat exchange switching mechanism 23 in FIG. 10), whereby the first heat-source-side heat exchanger 24 is caused to function as a refrigerant radiator and the second heat-source-side heat exchanger 25 is caused to function as a refrigerant evaporator. The high/low pressure switching mechanism 30 is also switched to a mainly-radiation-load operation state (indicated by broken lines in the high/low pressure switching mechanism 30 in FIG. 10). The opening degrees of the heat-source-side flow rate adjusting valves 26, 27 are also adjusted. Furthermore, the opening degree of the refrigerant-cooling-side flow rate adjusting valve 37 is adjusted, and high-pressure vapor refrigerant discharged from the compressor 21 flows to the precooling heat exchanger 35. In the connecting units 4a, 4b, 4c, 4d, the high-pressure vapor opening/closing valves 66c, 66d and the low-pressure vapor opening/closing valves 67a, 67b are placed in the open state, and the high-pressure vapor opening/closing valves 66a, 66b and the low-pressure vapor opening/closing valves 67c, 67d are placed in the closed state, whereby the usage-side heat exchangers 52a, 52b of the usage units 3a, 3b are caused to function as refrigerant evaporators, the usage-side heat exchangers 52c, 52d of the usage units 3c, 3d are caused to function as refrigerant radiators, the usage-side heat exchangers 52a, 52b of the usage units 3a, 3b and the intake side of the compressor 21 of the heat-source unit 2 are connected via the low-pressure vapor refrigerant communicating pipe 9, and the usage-side heat exchangers 52c, 52d of the usage units 3c, 3d and the discharge side of the compressor 21 of the heat-source unit 2 are connected via the high/low-pressure vapor refrigerant communicating pipe 8. In the usage units 3a, 3b, 3c, 3d, the opening degrees of the usage-side flow rate adjusting valves 51a, 51b, 51c, 51d are adjusted.

In the refrigerant circuit 10 thus configured, a portion of the high-pressure vapor refrigerant compressed and discharged by the compressor 21 is sent to the high/low-pressure vapor refrigerant communicating pipe 8 through the high/low pressure switching mechanism 30 and the high/low-pressure-vapor-side shutoff valve 32, and the remainder thereof is sent to the first heat-source-side heat exchanger 24 through the first heat exchange switching mechanism 22. The high-pressure vapor refrigerant compressed and discharged by the compressor 21 is also sent to the precooling heat exchanger 35.

The high-pressure vapor refrigerant sent to the high/low-pressure vapor refrigerant communicating pipe 8 is then sent to the high-pressure vapor connecting pipes 63c, 63d of the connecting units 4c, 4d. The high-pressure vapor refrigerant sent to the high-pressure vapor connecting pipes 63c, 63d is sent to the usage-side heat exchangers 52c, 52d of the usage units 3c, 3d through the high-pressure vapor opening/closing valves 66c, 66d and the merging vapor connecting pipes 65c, 65d.

The high-pressure vapor refrigerant sent to the usage-side heat exchangers 52c, 52d is then radiated in the usage-side heat exchangers 52c, 52d by heat exchange with indoor air supplied by the indoor fans 53c, 53d. Meanwhile, the indoor air is heated and supplied indoors, and air-heating operation by the usage units 3c, 3d is performed. After the refrigerant is radiated in the usage-side heat exchangers 52c, 52d, and the flow rate is adjusted in the usage-side flow rate adjusting valves 51c, 51d, the refrigerant is sent to the liquid connecting pipes 61c, 61d of the connecting units 4c, 4d.

The refrigerant radiated in the usage-side heat exchangers 52c, 52d and sent to the liquid connecting pipes 61c, 61d is then sent to the liquid refrigerant communicating pipe 7 and merged.

The refrigerant merged in the liquid refrigerant communicating pipe 7 is then branched into two streams and sent to the liquid connecting pipes 61a, 61b of the connecting units 4a, 4b. The refrigerant sent to the liquid connecting pipes 61a, 61b is then sent to the usage-side flow rate adjusting valves 51a, 51b of the usage units 3a, 3b.

After the refrigerant is sent to the usage-side flow rate adjusting valves 51a, 51b, and the flow rate is adjusted in the usage-side flow rate adjusting valves 51a, 51b, the refrigerant is evaporated in the usage-side heat exchangers 52a, 52b by heat exchange with indoor air supplied by the indoor fans 53a, 53b, and becomes low-pressure vapor refrigerant. Meanwhile, the indoor air is cooled and supplied indoors, and air-cooling operation by the usage units 3a, 3b is performed. The low-pressure vapor refrigerant is then sent to the merging vapor connecting pipes 65a, 65b of the connecting units 4a, 4b.

The low-pressure vapor refrigerant sent to the merging vapor connecting pipes 65a, 65b is then sent to the low-pressure vapor refrigerant communicating pipe 9 through the low-pressure vapor opening/closing valves 67a, 67b and the low-pressure vapor connecting pipes 64a, 64b and merged.

The low-pressure vapor refrigerant sent to the low-pressure vapor refrigerant communicating pipe 9 is then returned to the intake side of the compressor 21 through the vapor-side shutoff valve 33.

The high-pressure vapor refrigerant sent to the first heat-source-side heat exchanger 24 is also radiated in the first heat-source-side heat exchanger 24 by heat exchange with outdoor air supplied as a heat source by the outdoor fan 34. The refrigerant radiated in the first heat-source-side heat exchanger 24 then passes through the first heat-source-side flow rate adjusting valve 26, after which almost all thereof is sent to the second heat-source-side flow rate adjusting valve 27. The high-pressure vapor refrigerant sent to the precooling heat exchanger 35 is also radiated in the precooling heat exchanger 35 by heat exchange with outdoor air supplied as a heat source by the outdoor fan 34. The refrigerant radiated in the precooling heat exchanger 35 is then sent to the refrigerant cooler 36, and cools the electrical equipment item 20a. After the refrigerant passed through the refrigerant cooler 36, and the flow rate is adjusted in the refrigerant-cooling-side flow rate adjusting valve 37, the refrigerant is sent to the receiver outlet pipe 28b. The refrigerant sent to the receiver outlet pipe 28b is sent to the second heat-source-side flow rate adjusting valve 27 through the outlet check valve 29d. Therefore, the refrigerant radiated in the first heat-source-side heat exchanger 24 is not sent to the liquid refrigerant communicating pipe 7 through the receiver 28, the bridge circuit 29, and the liquid-side shutoff valve 31. After the refrigerant is sent to the second heat-source-side flow rate adjusting valve 27, and the flow rate is adjusted in the second heat-source-side flow rate adjusting valve 27, the refrigerant is evaporated in the second heat-source-side heat exchanger 25 by heat exchange with outdoor air supplied by the outdoor fan 34, and becomes low-pressure vapor refrigerant, and is sent to the second heat exchange switching mechanism 23. The low-pressure vapor refrigerant sent to the second heat exchange switching mechanism 23 is then merged with the low-pressure vapor refrigerant returned to the intake side of the compressor 21 through the low-pressure vapor refrigerant communicating pipe 9 and the vapor-side shutoff valve 33, and is returned to the intake side of the compressor 21.

Operation in the simultaneous cooling/heating operation mode (when the evaporation/radiation loads are balanced and refrigerant is circulated to the heat-source-side heat exchangers) is performed in the manner described above. In the simultaneous cooling/heating operation mode (when the evaporation/radiation loads are balanced and refrigerant is circulated to the heat-source-side heat exchangers), refrigerant is sent from the usage-side heat exchangers 52c, 52d functioning as refrigerant radiators to the usage-side heat exchangers 52a, 52b functioning as a refrigerant evaporator, as described above, whereby heat is recovered between the usage-side heat exchangers 52a, 52b, 52c, 52d. In the simultaneous cooling/heating operation mode (when the evaporation/radiation loads are balanced and refrigerant is circulated to the heat-source-side heat exchangers), the first heat-source-side heat exchanger 24 is caused to function as a refrigerant radiator and the second heat-source-side heat exchanger 25 is caused to function as a refrigerant evaporator, as described above, whereby an action is taken so that the evaporation load and the radiation load of the two heat-source-side heat exchangers 24, 25 cancel each other out. Furthermore, in the simultaneous cooling/heating operation mode (when the evaporation/radiation loads are balanced and refrigerant is circulated to the heat-source-side heat exchangers) it is possible for refrigerant to always be circulated to the refrigerant cooler 36 through the precooling heat exchanger 35, as described above. It is thereby possible to maintain the flow rate of refrigerant flowing through the refrigerant cooler 36 and cool the electrical equipment item 20a in the simultaneous cooling/heating operation mode (when the evaporation/radiation loads are balanced and refrigerant is circulated to the heat-source-side heat exchangers).

<Simultaneous Cooling/Heating Operation Mode (when the Evaporation/Radiation Loads are Balanced and Refrigerant is not Circulated to the Heat-Source-Side Heat Exchangers)>

Figure 11:
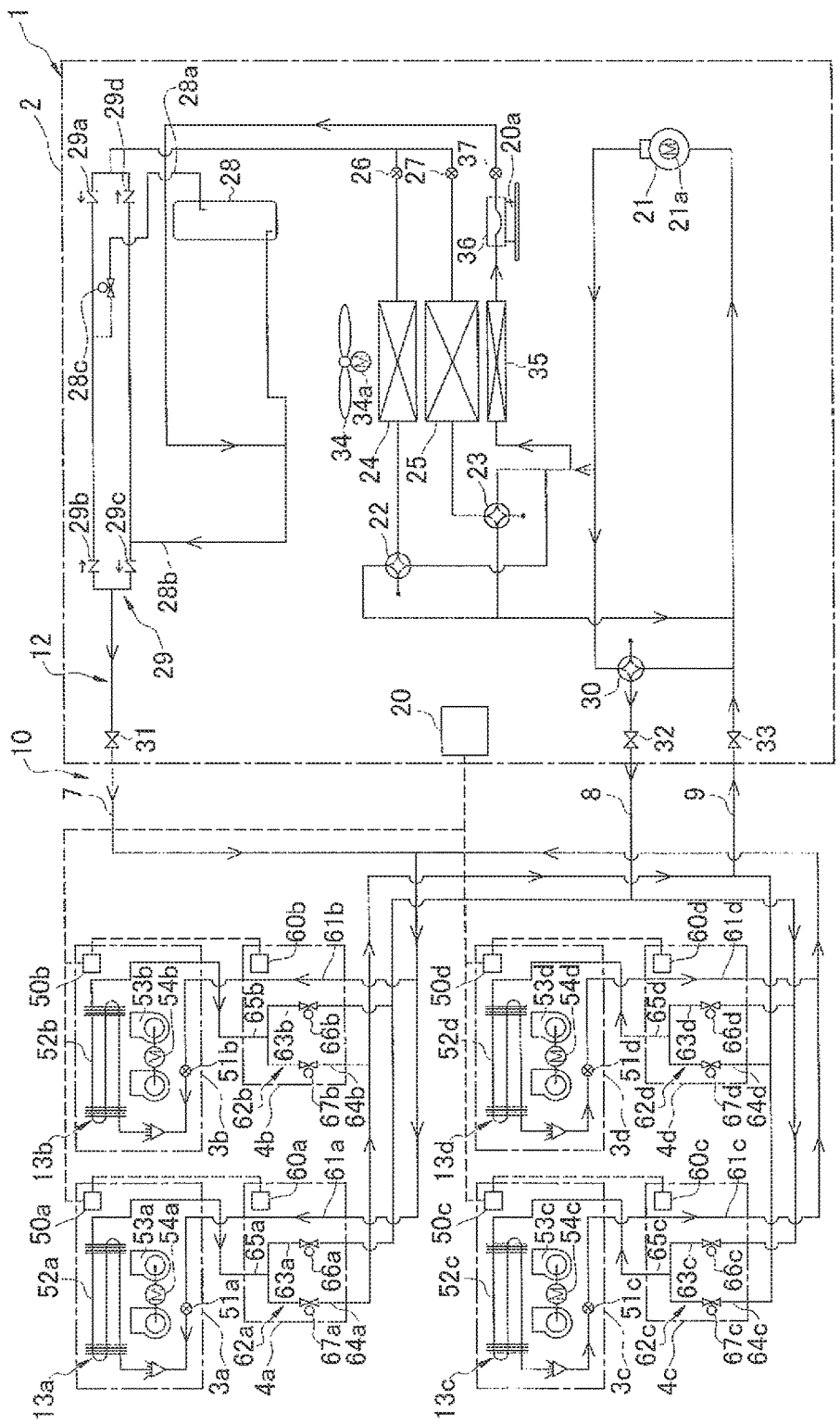
FIG. 11 is a view illustrating operation (refrigerant flow) in a simultaneous cooling/heating operation mode (when the evaporation/radiation loads are balanced and refrigerant is not circulated to the heat-source-side heat exchanger) of the simultaneous-cooling/heating-operation-type air conditioning apparatus.

In the simultaneous cooling/heating operation mode (when the evaporation/radiation loads are balanced and refrigerant is not circulated to the heat-source-side heat exchangers), e.g., when the usage units 3a, 3b are performing air-cooling operation and the usage units 3c, 3d are performing air-heating operation (i.e., operation in which the usage-side heat exchangers 52a, 52b function as refrigerant evaporators and the usage-side heat exchangers 52c, 52d function as refrigerant radiators), when refrigerant is not circulated to both the first heat-source-side heat exchanger 24 and the second heat-source-side heat exchanger 25 as main heat-source-side heat exchangers, the refrigerant circuit 10 of the air conditioning apparatus 1 is configured as illustrated in FIG. 11 (the flow of refrigerant being illustrated by arrows drawn in the refrigerant circuit 10 in FIG. 11).

Specifically, in the heat-source unit 2, the heat-source-side flow rate adjusting valves 26, 27 are placed in the closed state, whereby refrigerant is not circulated to both the first heat-source-side heat exchanger 24 and the second heat-source-side heat exchanger 25. The high/low pressure switching mechanism 30 is also switched to a mainly-radiation-load operation state (indicated by broken lines in the high/low pressure switching mechanism 30 in FIG. 11). Furthermore, the opening degree of the refrigerant-cooling-side flow rate adjusting valve 37 is adjusted, and high-pressure vapor refrigerant discharged from the compressor 21 flows to the precooling heat exchanger 35. In the connecting units 4a, 4b, 4c, 4d, the high-pressure vapor opening/closing valves 66c, 66d and the low-pressure vapor opening/closing valves 67a, 67b are placed in the open state, and the high-pressure vapor opening/closing valves 66a, 66b and the low-pressure vapor opening/closing valves 67c, 67d are placed in the closed state, whereby the usage-side heat exchangers 52a, 52b of the usage units 3a, 3b are caused to function as refrigerant evaporators, the usage-side heat exchangers 52c, 52d of the usage units 3c, 3d are caused to function as refrigerant radiators, the usage-side heat exchangers 52a, 52b of the usage units 3a, 3b and the intake side of the compressor 21 of the heat-source unit 2 are connected via the low-pressure vapor refrigerant communicating pipe 9, and the usage-side heat exchangers 52c, 52d of the usage units 3c, 3d and the discharge side of the compressor 21 of the heat-source unit 2 are connected via the high/low-pressure vapor refrigerant communicating pipe 8. In the usage units 3a, 3b, 3c, 3d, the opening degrees of the usage-side flow rate adjusting valves 51a, 51b, 51c, 51d are adjusted.

In the refrigerant circuit 10 thus configured, a portion of the high-pressure vapor refrigerant compressed and discharged by the compressor 21 is sent to the high/low-pressure vapor refrigerant communicating pipe 8 through the high/low pressure switching mechanism 30 and the high/low-pressure-vapor-side shutoff valve 32, and the remainder thereof is sent only to the precooling heat exchanger 35.

The high-pressure vapor refrigerant sent to the precooling heat exchanger 35 is then radiated in the precooling heat exchanger 35 by heat exchange with outdoor air supplied as a heat source by the outdoor fan 34. The refrigerant radiated in the precooling heat exchanger 35 is then sent to the refrigerant cooler 36, and cools the electrical equipment item 20a. After the refrigerant passed through the refrigerant cooler 36, and the flow rate is adjusted in the refrigerant-cooling-side flow rate adjusting valve 37, the refrigerant is sent to the receiver outlet pipe 28b. The refrigerant sent to the receiver outlet pipe 28b is sent to the liquid refrigerant communicating pipe 7 through the outlet check valve 29c and the liquid-side shutoff valve 31. A state therefore occurs in which no refrigerant is sent to the liquid refrigerant communicating pipe 7 through the heat-source-side heat exchangers 24, 25, and a small flow of refrigerant is sent through the precooling heat exchanger 35 and the refrigerant cooler 36.

The high-pressure vapor refrigerant sent to the high/low-pressure vapor refrigerant communicating pipe 8 is sent to the high-pressure vapor connecting pipes 63c, 63d of the connecting units 4c, 4d. The high-pressure vapor refrigerant sent to the high-pressure vapor connecting pipes 63c, 63d is sent to the usage-side heat exchangers 52c, 52d of the usage units 3c, 3d through the high-pressure vapor opening/closing valves 66c, 66d and the merging vapor connecting pipes 65c, 656d.

The high-pressure vapor refrigerant sent to the usage-side heat exchangers 52c, 52d is then radiated in the usage-side heat exchangers 52c, 52d by heat exchange with indoor air supplied by the indoor fans 53c, 53d. Meanwhile, the indoor air is heated and supplied indoors, and air-heating operation by the usage units 3c, 3d is performed. After the refrigerant is radiated in the usage-side heat exchangers 52c, 52d, and the flow rate is adjusted in the usage-side flow rate adjusting valves 51c, 51d, the refrigerant is sent to the liquid connecting pipes 61c, 61d of the connecting units 4c, 4d.

The refrigerant radiated in the usage-side heat exchangers 52c, 52d and sent to the liquid connecting pipes 61c, 61d is then sent to the liquid refrigerant communicating pipe 7 and merged.

The refrigerant merged in the liquid refrigerant communicating pipe 7 is furthermore merged with the small flow of refrigerant sent to the liquid refrigerant communicating pipe 7 through the precooling heat exchanger 35 and the refrigerant cooler 36, after which the refrigerant is branched into two streams and sent to the liquid connecting pipes 61a, 61b of the connecting units 4a, 4b, The refrigerant sent to the liquid connecting pipes 61a, 61b is then sent to the usage-side flow rate adjusting valves 51a, 51b of the usage units 3a, 3b.

After the refrigerant is sent to the usage-side flow rate adjusting valves 51a, 51b, and the flow rate is adjusted in the usage-side flow rate adjusting valves 51a, 51b, the refrigerant is evaporated in the usage-side heat exchangers 52a, 52b by heat exchange with indoor air supplied by the indoor fans 53a, 53b, and becomes low-pressure vapor refrigerant. Meanwhile, the indoor air is cooled and supplied indoors, and air-cooling operation by the usage units 3a, 3b is performed. The low-pressure vapor refrigerant is then sent to the merging vapor connecting pipes 65a, 65b of the connecting units 4a, 4b.

The low-pressure vapor refrigerant sent to the merging vapor connecting pipes 65a, 65b is then sent to the low-pressure vapor refrigerant communicating pipe 9 through the low-pressure vapor opening/closing valves 67a, 67b and the low-pressure vapor connecting pipes 64a, 64b and merged.

The low-pressure vapor refrigerant sent to the low-pressure vapor refrigerant communicating pipe 9 is then returned to the intake side of the compressor 21 through the vapor-side shutoff valve 33.

Operation in the simultaneous cooling/heating operation mode (when the evaporation/radiation loads are balanced and refrigerant is not circulated to the heat-source-side heat exchangers) is performed in the manner described above. In the simultaneous cooling/heating operation mode (when the evaporation/radiation loads are balanced and refrigerant is not circulated to the heat-source-side heat exchangers), refrigerant is sent from the usage-side heat exchangers 52c, 52d functioning as refrigerant radiators to the usage-side heat exchangers 52a, 52b functioning as a refrigerant evaporator, as described above, whereby heat is recovered between the usage-side heat exchangers 52a, 52b, 52c, 52d. In the simultaneous cooling/heating operation mode (when the evaporation/radiation loads are balanced and refrigerant is not circulated to the heat-source-side heat exchangers), as described above, an action is taken so that refrigerant is not circulated to both the first heat-source-side heat exchanger 24 and the second heat-source-side heat exchanger 25. Furthermore, in the simultaneous cooling/heating operation mode (when the evaporation/radiation loads are balanced and refrigerant is not circulated to the heat-source-side heat exchangers) it is possible for refrigerant to always be circulated to the refrigerant cooler 36 through the precooling heat exchanger 35, as described above. It is thereby possible to maintain the flow rate of refrigerant flowing through the refrigerant cooler 36 and cool the electrical equipment item 20a in the simultaneous cooling/heating operation mode (when the evaporation/radiation loads are balanced and refrigerant is not circulated to the heat-source-side heat exchangers).

(3) Features of the Heat-Recovery-Type Refrigerating Apparatus

The simultaneous-cooling/heating-operation-type air conditioning apparatus 1 has such features as those described below.

<A>

As described above, in providing the refrigerant cooler 36 for cooling the electrical equipment item 20a, a configuration is adopted in which a portion of the heat-source-side heat exchangers 24, 25, 35 is configured as a precooling heat exchanger 35 for always circulating high-pressure vapor refrigerant discharged from the compressor 21, and the refrigerant cooler 36 is connected to the downstream side of the precooling heat exchanger 35. It is therefore possible for refrigerant to always be circulated to the refrigerant cooler 36 through the precooling heat exchanger 35. Specifically, it is possible for refrigerant to always be circulated to the refrigerant cooler 36 through the precooling heat exchanger 35 in any of the air-cooling operation mode (large evaporation load), the air-cooling operation mode (small evaporation load), the air-heating operation mode (large radiation load), the air-heating operation mode (small radiation load), the simultaneous cooling/heating operation mode (mainly evaporation load), the simultaneous cooling/heating operation mode (mainly radiation load), the simultaneous cooling/heating operation mode (when the evaporation/radiation loads are balanced and refrigerant is circulated to the heat-source-side heat exchangers), and the simultaneous cooling/heating operation mode (when the evaporation/radiation loads are balanced and refrigerant is not circulated to the heat-source-side heat exchangers) described above.

It is thereby possible to maintain the flow rate of refrigerant flowing through the refrigerant cooler 36 and cool the electrical equipment item 20a during heat recovery between the usage-side heat exchangers such as in the simultaneous cooling/heating operation mode (mainly evaporation load), the simultaneous cooling/heating operation mode (mainly radiation load), the simultaneous cooling/heating operation mode (when the evaporation/radiation loads are balanced and refrigerant is circulated to the heat-source-side heat exchangers), and the simultaneous cooling/heating operation mode (when the evaporation/radiation loads are balanced and refrigerant is not circulated to the heat-source-side heat exchangers), i.e., even when the flow rate of refrigerant flowing between the heat-source-side heat exchangers 24, 25 as main heat-source-side heat exchangers and the usage-side heat exchangers 52a, 52b, 52c, 52d is reduced. Particularly in the simultaneous cooling/heating operation mode (when the evaporation/radiation loads are balanced and refrigerant is circulated to the heat-source-side heat exchangers) and the simultaneous cooling/heating operation mode (when the evaporation/radiation loads are balanced and refrigerant is not circulated to the heat-source-side heat exchangers), a state occurs in which almost no refrigerant flows between the heat-source-side heat exchangers 24, 25 as main heat-source-side heat exchangers and the usage-side heat exchangers 52a, 52b, 52c, 52d, but even in this case, it is possible to maintain the flow rate of refrigerant flowing through the refrigerant cooler 36 and cool the electrical equipment item 20a.

<B>

As described above, a configuration is adopted in which the refrigerant-cooling-side flow rate adjusting valve 37 as a refrigerant-cooling-side flow rate adjusting mechanism is connected to the downstream side of the refrigerant cooler 36. The flow rate of refrigerant flowing through the precooling, heat exchanger 35, and consequently the flow rate of refrigerant flowing through the refrigerant cooler 36, can thereby be appropriately adjusted.

<C>

As described above, a configuration is adopted in which the outlet of the refrigerant-cooling-side flow rate adjusting valve 37 as a refrigerant-cooling-side flow rate adjusting mechanism for adjusting the flow rate of refrigerant flowing through the precooling heat exchanger 35 and the refrigerant cooler 36 is connected to the downstream side of the heat-source-side flow rate adjusting valves 26, 27 as heat-source-side flow rate adjusting mechanisms when the heat-source-side heat exchangers 24, 25 as main heat-source-side heat exchangers function as refrigerant radiators. The flow rate of refrigerant flowing through the heat-source-side heat exchangers 24, 25 can thereby be adjusted by the heat-source-side flow rate adjusting valves 26, 27, and separately from this adjustment, the flow rate of refrigerant flowing through the precooling heat exchanger 35 and the refrigerant cooler 36 can be adjusted by the refrigerant-cooling-side flow rate adjusting valve 37.

In particular, the main heat-source-side heat exchangers are divided into the first heat-source-side heat exchanger 24 and the second heat-source-side heat exchanger 25, and the heat-source-side flow rate adjusting valves 26, 27 are provided to the heat-source-side heat exchangers 24, 25 in this configuration, as described above. The flow rates of refrigerant flowing through the heat-source-side heat exchangers 24, 25 can therefore be individually adjusted, and the heat-source-side heat exchangers 24, 25 can each individually be switched between functioning as a refrigerant evaporator or a refrigerant radiator. A configuration is also adopted in which the outlet of the refrigerant-cooling-side flow rate adjusting valve 37 for adjusting the flow rate of refrigerant flowing through the precooling heat exchanger 35 and the refrigerant cooler 36 is connected to the downstream side of the heat-source-side flow rate adjusting valves 26, 27 when the two heat-source-side heat exchangers 24, 25 function as refrigerant radiators, as described above. The flow rates of refrigerant flowing through the two heat-source-side heat exchangers 24, 25 can thereby be individually adjusted by the heat-source-side flow rate adjusting valves 26, 27, and separately from this adjustment, the flow rate of refrigerant flowing through the precooling heat exchanger 35 and the refrigerant cooler 36 can be adjusted by the refrigerant-cooling-side flow rate adjusting valve 37.

<D>

A configuration is adopted in which the precooling heat exchanger 35 constitutes a bottom part of the heat-source-side heat exchangers 24, 25, 35, as described above. For example, in a case in which the heat-source-side heat exchangers have a structure in which a plurality of refrigerant paths through which refrigerant flows in a horizontal direction are arranged in a plurality of levels in a vertical direction, the precooling heat exchanger 35 constitutes the refrigerant path on the lowermost level among the plurality of refrigerant paths. Through this configuration, high-pressure vapor refrigerant discharged from the compressor 21 is always circulated to the bottom part of the heat-source-side heat exchangers 24, 25, 35, and freezing of the bottom part of the heat-source-side heat exchangers 24, 25, 35 can be suppressed.

(4) Modification

The configuration of a simultaneous-cooling/heating-operation-type air conditioning apparatus 1 is described in the above embodiment as an example of a heat-recovery-type refrigerating apparatus to which the present invention is applied, but the present invention is not limited to this configuration. Specifically, the present invention can be applied to any configuration including a compressor, a heat-source-side heat exchanger, and a plurality of usage-side heat exchangers, in which refrigerant is sent from a usage-side heat exchanger functioning as a refrigerant radiator to a usage-side heat exchanger functioning as a refrigerant evaporator, whereby heat can be recovered between the usage-side heat exchangers.

In the above embodiment, a structure is adopted in which the main heat-source-side heat exchangers which are the portion of the heat-source-side heat exchangers excluding the precooling heat exchanger 35 are divided into two heat-source-side heat exchangers 24, 25. However, a divided structure need not be adopted. When a divided structure is not adopted, only a single heat-source-side flow rate adjusting valve is needed as a heat-source-side flow rate adjusting mechanism.

INDUSTRIAL APPLICABILITY

The present invention is broadly applicable to a heat-recovery-type refrigerating apparatus including a compressor, a heat-source-side heat exchanger, and a plurality of usage-side heat exchangers, in which refrigerant is sent from the usage-side heat exchanger functioning as a refrigerant radiator to the usage-side heat exchanger functioning as a refrigerant evaporator, whereby heat can be recovered between the usage-side heat exchangers.

What is claimed is:

1. A heat-recovery-type refrigerating apparatus comprising:
    a compressor;
    a heat-source-side heat exchanger, a portion of said heat-source-side heat exchanger being configured as a precooling heat exchanger arranged and configured to always circulate high-pressure vapor refrigerant discharged from said compressor;
    a plurality of usage-side heat exchangers individually switchable between functioning as refrigerant evaporators or refrigerant radiators, refrigerant being sent from said usage-side heat exchanger functioning as a refrigerant radiator to said usage-side heat exchanger functioning as a refrigerant evaporator such that heat can be recovered between said usage-side heat exchangers;
    a refrigerant cooler connected to a downstream side of said precooling heat exchanger, said refrigerant cooler being arranged and configured to cool an electrical equipment item;
    a refrigerant-cooling-side flow rate adjusting mechanism connected to a downstream side of said refrigerant cooler, said refrigerant-cooling-side flow rate adjusting mechanism being arranged and configured to adjust a flow rate of refrigerant flowing through said precooling heat exchanger; and
    a heat-source-side flow rate adjusting mechanism connected to a liquid side of a main heat-source-side heat exchanger, said heat-source-side flow rate adjusting mechanism being arranged and configured to adjust a flow rate of refrigerant flowing through the main heat-source-side heat exchanger, and said main heat-source-side heat exchanger being a portion of said heat-source-side heat exchanger excluding said precooling heat exchanger,
    an outlet of said refrigerant-cooling-side flow rate adjusting mechanism being connected to a downstream side of said heat-source-side flow rate adjusting mechanism when said main heat-source-side heat exchanger is caused to function as a refrigerant radiator.

2. The heat-recovery-type refrigerating apparatus according to claim 1, wherein
    said main heat-source-side heat exchanger has a first heat-source-side heat exchanger and a second heat-source-side heat exchanger,
    said heat-source-side flow rate adjusting mechanism has
        a first heat-source-side flow rate adjusting mechanism arranged and configured to adjust a flow rate of refrigerant flowing through said first heat-source-side heat exchanger, and
        a second heat-source-side flow rate adjusting mechanism arranged and configured to adjust a flow rate of refrigerant flowing through said second heat-source-side heat exchanger, and
    the outlet of said refrigerant-cooling-side flow rate adjusting mechanism is connected
        to a downstream side of said first heat-source-side flow rate adjusting mechanism when said first heat-source-side heat exchanger is caused to function as a refrigerant radiator, and
        to a downstream side of said second heat-source-side flow rate adjusting mechanism when said second heat-source-side heat exchanger is caused to function as a refrigerant radiator.

3. The heat-recovery-type refrigerating apparatus according to claim 2, wherein
    said precooling heat exchanger constitutes a bottom part of said heat-source-side heat exchanger.

4. The heat-recovery-type refrigerating apparatus according to claim 3, wherein
    said heat-source-side heat exchanger has a plurality of refrigerant paths through which refrigerant flows in a horizontal direction, and said plurality of refrigerant paths are arranged in a plurality of levels along a vertical direction, and said precooling heat exchanger constitutes a refrigerant path on a lowermost level of the plurality of refrigerant paths.

5. The heat-recovery-type refrigerating apparatus according to claim 1, wherein
said precooling heat exchanger constitutes a bottom part of said heat-source-side heat exchanger.

6. The heat-recovery-type refrigerating apparatus according to claim 5, wherein
said heat-source-side heat exchanger has a plurality of refrigerant paths through which refrigerant flows in a horizontal direction, and said plurality of refrigerant paths are arranged in a plurality of levels along a vertical direction, and
said precooling heat exchanger constitutes the refrigerant path on a lowermost level of the plurality of refrigerant paths.

7. The heat-recovery-type refrigerating apparatus according to claim 1, wherein
said precooling heat exchanger constitutes a bottom part of said heat-source-side heat exchanger.

8. The heat-recovery-type refrigerating apparatus according to claim 7, wherein
said heat-source-side heat exchanger has a plurality of refrigerant paths through which refrigerant flows in a horizontal direction, and said plurality of refrigerant paths are arranged in a plurality of levels along a vertical direction, and
said precooling heat exchanger constitutes a refrigerant path on a lowermost level of the plurality of refrigerant paths.

* * * * *